US012662749B2

(12) United States Patent
Wu et al.

(10) Patent No.: US 12,662,749 B2
(45) Date of Patent: Jun. 23, 2026

(54) METHODS FOR ADDING A PLURALITY OF DOPANT BATCHES TO AN INGOT PULLER APPARATUS

(71) Applicant: GlobalWafers Co., Ltd., Hsinchu (TW)

(72) Inventors: Chun-Sheng Wu, Hsinchu City (TW); Hong-Huei Huang, Zhubei City (TW); Hsien-Ta Tseng, Zhunan Township (TW); Chen-Yi Lin, Zhunan Township (TW); Feng-Chien Tsai, Zhubei City (TW); Yu-Chiao Wu, Frontenac, MO (US); Benjamin Michael Meyer, Defiance, MO (US); Young Gil Jeong, Frisco, TX (US); Che-Min Chang, Taipei City (TW); Carissima Marie Hudson, Saint Charles, MO (US)

(73) Assignee: GlobalWafers, Co. Ltd., Hsinchu (TW)

( * ) Notice: Subject to any disclaimer, the term of this patent is extended or adjusted under 35 U.S.C. 154(b) by 281 days.

(21) Appl. No.: 18/323,775

(22) Filed: May 25, 2023

(65) Prior Publication Data

US 2024/0392467 A1      Nov. 28, 2024

(51) Int. Cl.
 C30B 15/04      (2006.01)
 C30B 15/10      (2006.01)
 C30B 15/14      (2006.01)
(52) U.S. Cl.
 CPC .............. C30B 15/04 (2013.01); C30B 15/10 (2013.01); C30B 15/14 (2013.01)
(58) Field of Classification Search
 CPC ......... C30B 15/00; C30B 15/02; C30B 15/04;

C30B 15/10; C30B 15/14; C30B 15/20;
C30B 29/00; C30B 29/02; C30B 29/06;
C30B 35/00; C30B 35/007
USPC ....... 117/11, 13, 19, 21, 200, 206, 208, 214,
117/928, 931–932
See application file for complete search history.

(56) References Cited

U.S. PATENT DOCUMENTS

| 2,935,385 | A | * | 5/1960 | Boyd ...................... C30B 15/30 |
| | | | | 117/936 |
| 5,242,531 | A | * | 9/1993 | Klingshirn .............. C30B 15/04 |
| | | | | 117/31 |
| 6,277,192 | B1 | | 8/2001 | Altekrüger et al. |
| 9,786,748 | B2 | | 10/2017 | Caspary et al. |
| 10,337,117 | B2 | | 7/2019 | Caspary et al. |
| 10,378,122 | B2 | | 8/2019 | Kang et al. |
| 10,400,353 | B2 | | 9/2019 | Hoshi et al. |
| 11,242,616 | B2 | | 2/2022 | Caspary et al. |
| 11,585,010 | B2 | | 2/2023 | Luter et al. |

(Continued)

FOREIGN PATENT DOCUMENTS

| EP | 2697412 A1 | 2/2014 |
| JP | 2012066965 A | 4/2012 |

(Continued)

*Primary Examiner* — Kenneth A Bratland, Jr.
(74) *Attorney, Agent, or Firm* — Armstrong Teasdale LLP

(57) ABSTRACT

Ingot puller apparatus for producing a doped single crystal silicon ingot are disclosed. The ingot puller apparatus includes a dopant feeder having a first dopant receptacle for holding a first batch of dopant and a second dopant receptacle for holding a second batch of dopant. A rotation mechanism rotates the first dopant receptacle to release the first batch of dopant into the crucible and rotates the second dopant receptacle to release the second batch of dopant into the crucible.

15 Claims, 34 Drawing Sheets

(56)     References Cited

U.S. PATENT DOCUMENTS

| 2003/0061985 | A1 | 4/2003 | Kulkarni et al. |
| 2007/0193501 | A1 | 8/2007 | Ono et al. |
| 2009/0266294 | A1 | 10/2009 | Javidi et al. |
| 2010/0151667 | A1 | 6/2010 | Narushima et al. |
| 2012/0301386 | A1 * | 11/2012 | Johnson .................. C30B 15/12 |
| | | | 117/214 |
| 2017/0260645 | A1 | 9/2017 | Hoshi et al. |
| 2018/0230622 | A1 | 8/2018 | Caspary et al. |
| 2018/0237937 | A1 | 8/2018 | Kang et al. |
| 2022/0205130 | A1 | 6/2022 | Zardoni et al. |
| 2022/0205131 | A1 | 6/2022 | Wu et al. |
| 2022/0205132 | A1 | 6/2022 | Wu et al. |
| 2023/0160093 | A1 | 5/2023 | Luter et al. |
| 2023/0160094 | A1 | 5/2023 | Luter et al. |
| 2024/0167193 | A1 | 5/2024 | Ryu et al. |
| 2024/0368801 | A1 | 11/2024 | Ji et al. |

FOREIGN PATENT DOCUMENTS

| JP | 2016050140 | A | 4/2016 | |
| JP | 2016060667 | A | 4/2016 | |
| JP | 06304125 | B2 | 12/2016 | |
| JP | 2016216306 | A | 12/2016 | |
| JP | 06073316 | B2 | 2/2017 | |
| JP | 06222013 | B2 | 11/2017 | |
| JP | 06299543 | B2 | 3/2018 | |
| JP | 2023020503 | A | 2/2023 | |
| WO | WO-2009119342 | A1 * | 10/2009 | ............. C30B 29/06 |
| WO | 2013014341 | A1 | 1/2013 | |
| WO | 2013014342 | A1 | 1/2013 | |
| WO | 2016031164 | A1 | 3/2016 | |
| WO | 2017026648 | A1 | 2/2017 | |
| WO | 2017202656 | A1 | 11/2017 | |

* cited by examiner

METHODS FOR ADDING A PLURALITY OF DOPANT BATCHES TO AN INGOT PULLER APPARATUS

TECHNICAL FIELD

The field of the disclosure relates to ingot puller apparatus for producing single crystal silicon ingots having dopant feeders for adding a plurality of batches of dopant to the silicon melt.

BACKGROUND

End-users of single crystal silicon wafers increasingly desire silicon wafers with a narrow range of resistivity. Silicon wafers are typically sliced from single crystal silicon ingots grown using the Czochralski (Cz) method. The electrical properties, such as resistivity, of silicon wafers are built with different dopants (e.g., boron). In the Cz crystal process, solid-phase silicon is melted to the liquid state. Dopants are added to the silicon to achieve a target resistivity range. As liquid silicon continues to solidify in the single-crystal silicon ingot, the net dopant concentration in the liquid silicon decreases which can cause the resistivity to fall out of customer specifications.

Counter-doping is used in various solar and semiconductor applications to increase throughput and prime yield of the single crystal silicon ingot. For example, N-type IGBT applications may involve counter-doping with P-type dopants to achieve relatively tight resistivity tolerances (e.g., <+/−13% range or less).

A need exists for apparatus to add multiple batches of dopant to the silicon melt during ingot growth in doping or counter-doping applications to maintain the resistivity of the silicon ingot in the target range.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to an ingot puller apparatus for producing a doped single crystal silicon ingot. The ingot puller apparatus includes an ingot puller outer housing. An ingot puller inner chamber is formed within the ingot puller outer housing. A crucible is disposed within the ingot puller inner chamber. The apparatus includes a dopant feeder for adding dopant to the crucible. The dopant feeder includes a first dopant receptacle for holding a first batch of dopant, a second dopant receptacle for holding a second batch of dopant, and a rotation mechanism for rotating the first dopant receptacle to release the first batch of dopant into the crucible and for rotating the second dopant receptacle to release the second batch of dopant into the crucible. A tube is disposed below the dopant feeder for transporting the first and second batches of dopant to the crucible.

Another aspect of the present disclosure is directed a method for producing a single crystal silicon ingot from a silicon melt held within a crucible. Solid-state silicon is added to the crucible. The crucible is disposed within an ingot puller inner chamber. The polycrystalline silicon is heated to cause a silicon melt to form in the crucible. A single crystal silicon ingot is pulled from the silicon melt. A rotation mechanism is operated to rotate a first dopant receptacle to release a first batch of dopant from the first dopant receptacle and cause the first batch of dopant to enter the silicon melt while pulling the single crystal silicon ingot from the silicon melt. The rotation mechanism is operated to rotate a second dopant receptacle to release a second batch of dopant from the second dopant receptacle and cause the second batch of dopant to enter the silicon melt while pulling the single crystal silicon ingot from the silicon melt and after the first batch of dopant is released from the first dopant receptacle.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
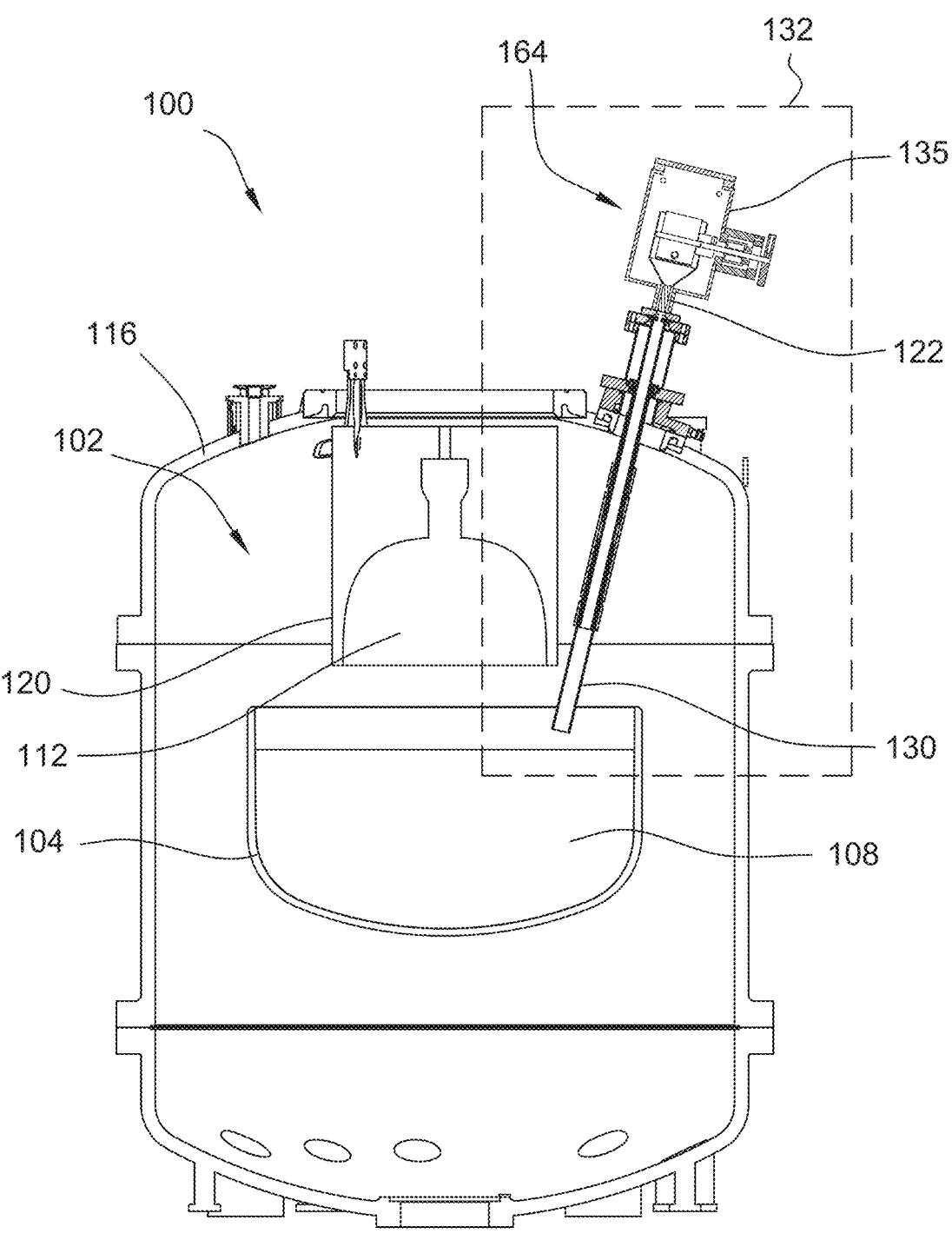
FIG. 1 is a cross-section of an ingot puller apparatus having a dopant feed system.

Provisions of the present disclosure relate to dopant feeders for adding dopant to a silicon melt held within a crucible of an ingot puller apparatus. An example ingot puller apparatus 100 in which the dopant feeders of the present disclosure may be used is shown in FIG. 1. The ingot puller apparatus 100 includes an ingot puller outer housing 116 that defines an ingot puller inner chamber 102 within the housing 116. A crucible 104 is disposed within the ingot puller inner chamber 102. The crucible 104 contains the silicon melt 108 from which the silicon ingot 112 is pulled. The ingot 112 is shrouded by a heat shield 120.

The ingot puller apparatus 100 includes a dopant feed system 132. The dopant feed system 132 includes a dopant feeder 164 and dopant tube 130 that extends through the housing 116 (and in some instances through a reflector) for adding solid-phase dopant to the crucible 104. Solid-phase dopant passes through the dopant tube 130 (and may at least partially sublime during transport) to contact the melt 108 to cause the melt 108 to be doped. The dopant tube 130 includes an inlet 122 disposed exterior to the ingot puller inner chamber 102 and an outlet 126 disposed in the ingot puller inner chamber 102 and positioned relatively near the surface of the melt 108.

The dopant feeder 164 is disposed exterior to the ingot puller inner chamber 102. The dopant feeder 164 includes a dopant feeder housing 135 and one or more dopant receptacles (discussed further below) disposed within the housing

135 for adding solid-phase dopant to the melt 108. The dopant feed system 132 may include an isolation valve (not shown) below the dopant feeder 164 to allow the dopant feeder 164 to be isolated and to return to atmospheric pressure to allow dopant to be added to the dopant feeder. The dopant feeder housing 135 is external to the ingot puller outer housing 116.

Figure 3:
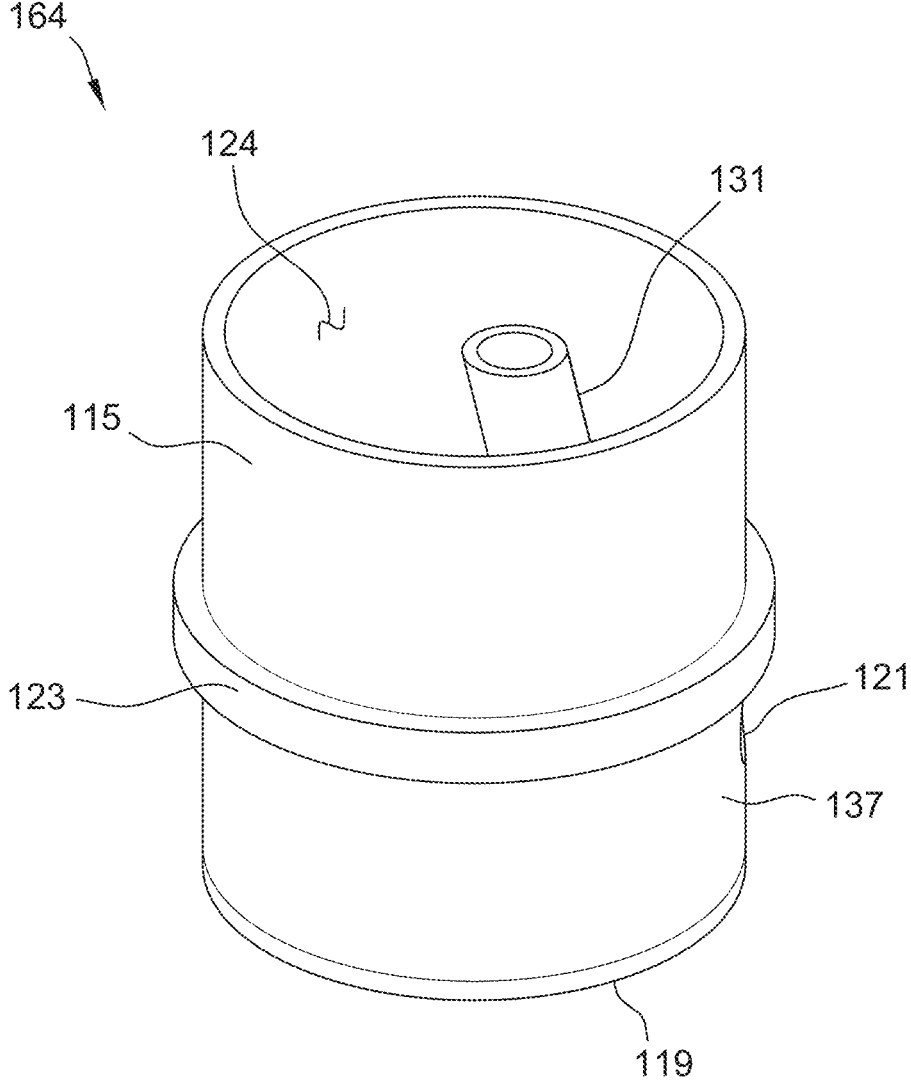
FIG. 3 is a perspective view of a dopant feeder that includes a dopant cup and two dopant receptacles disposed therein.

Referring now to FIG. 3, in the illustrated embodiment, a plurality of dopant receptacles are disposed in a dopant cup 137. While the receptacles described herein (first, second, third, fourth, fifth receptacles, etc.) may be shown and described as being disposed in a dopant cup 137, in other embodiments, the receptacles are not disposed in a cup (e.g., not disposed in any further container or disposed or a container other than a cup). The dopant cup and receptacles of the various embodiments described herein may be made of quartz or any material suitable for use in the environment of an ingot puller apparatus.

The cup 137 includes a sidewall 115, floor 119, first opening 121, and second opening 124. The first opening 121 is formed in the sidewall 115. The second opening 124 is opposite the floor 119 and has a diameter equal to the diameter of the sidewall 115. In other embodiments, a smaller second opening may be used (i.e., in embodiments in which the cup 137 includes a cover opposite the floor 119).

Figure 4:
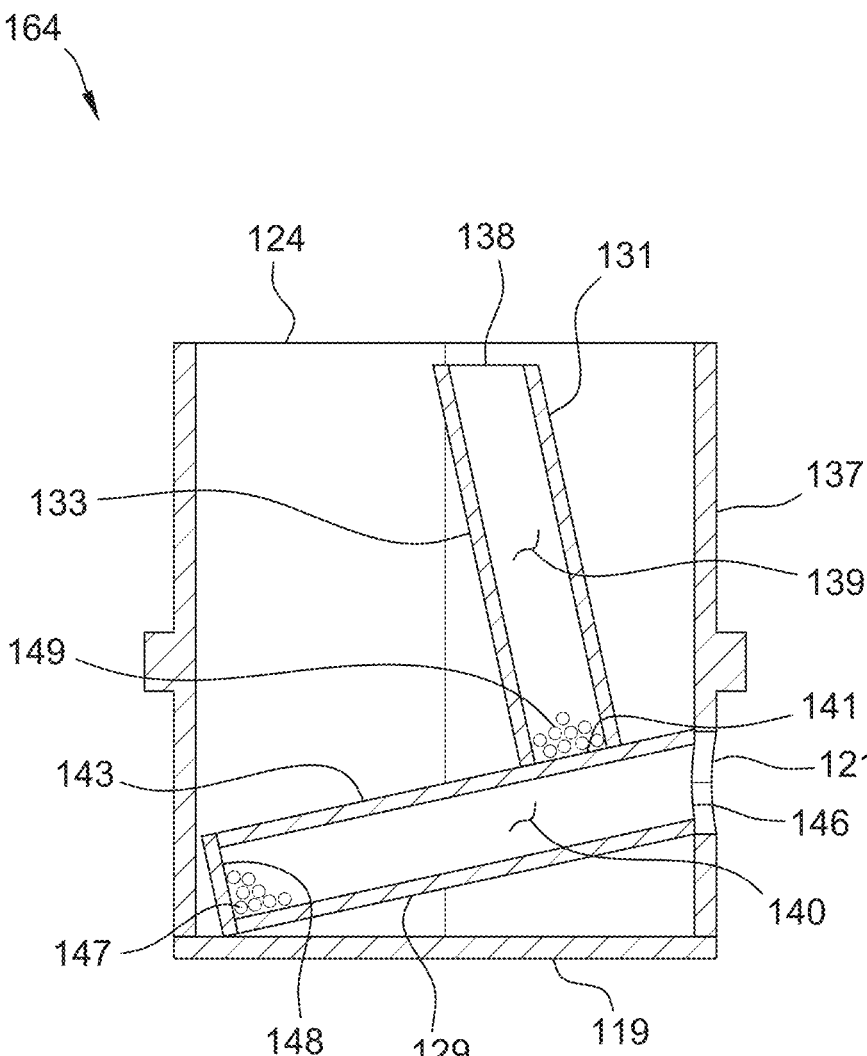
FIG. 4 is a cross-section view of the dopant feeder in an initial position.

Referring now to FIG. 4, a first dopant receptacle 129 and second dopant receptacle 131 are disposed in the cup 137. In the illustrated embodiment, the first and second dopant receptacle 129, 131 are tubes. The first dopant receptacle 129 includes one or more sidewalls 143, floor 148 and second dopant receptacle inner chamber 140. The first dopant receptacle 129 has an outlet 146 that is aligned with the first opening 121 of the dopant cup 137. The second dopant receptacle 131 includes one or more sidewalls 133 and has a floor 141 (which is the sidewall 143 of the first dopant receptacle) which define a second receptacle inner chamber 139. The second dopant receptacle 131 has an outlet 138 that is aligned with the second cup opening 124. The first dopant receptacle 129 holds a first batch of dopant 147 and the second dopant receptacle 131 holds a second batch of dopant 149.

Figure 2:
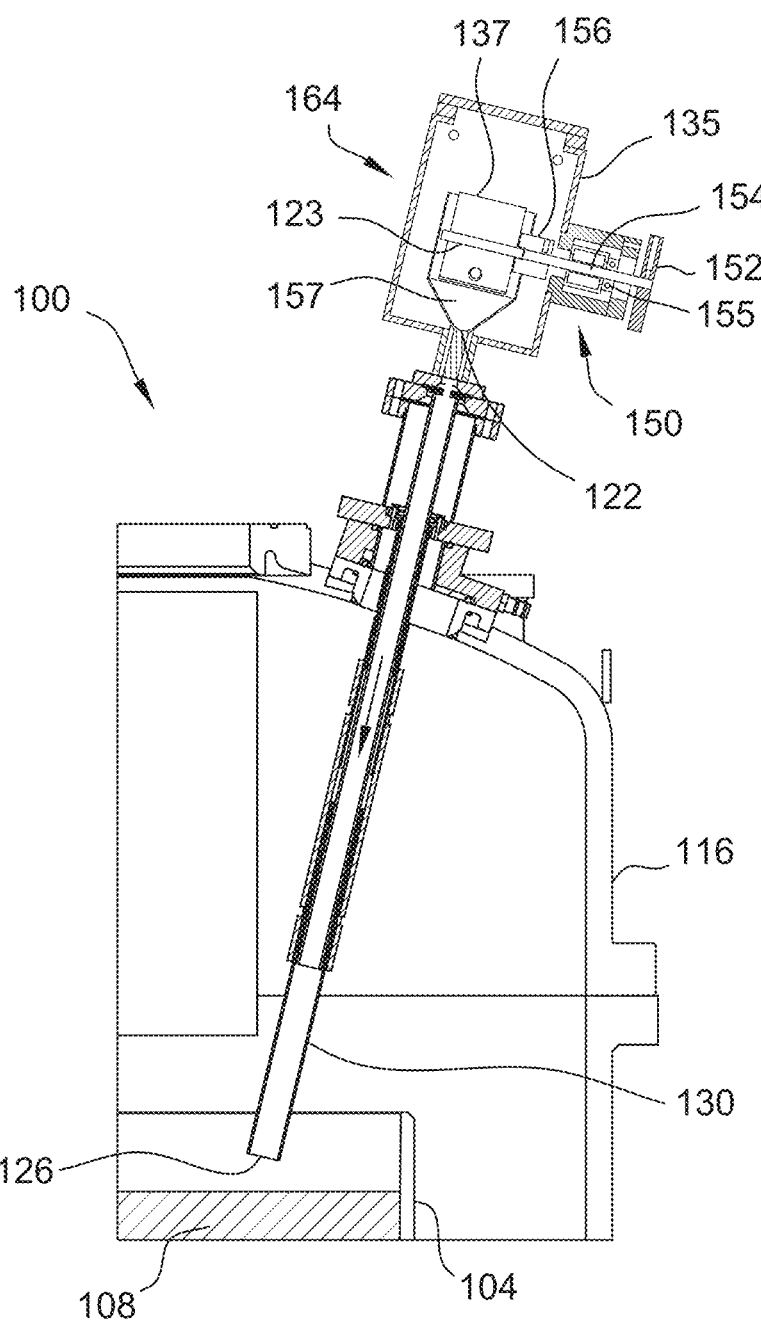
FIG. 2 is a detailed cross-section of the ingot puller apparatus and dopant feed system.
Figure 33:
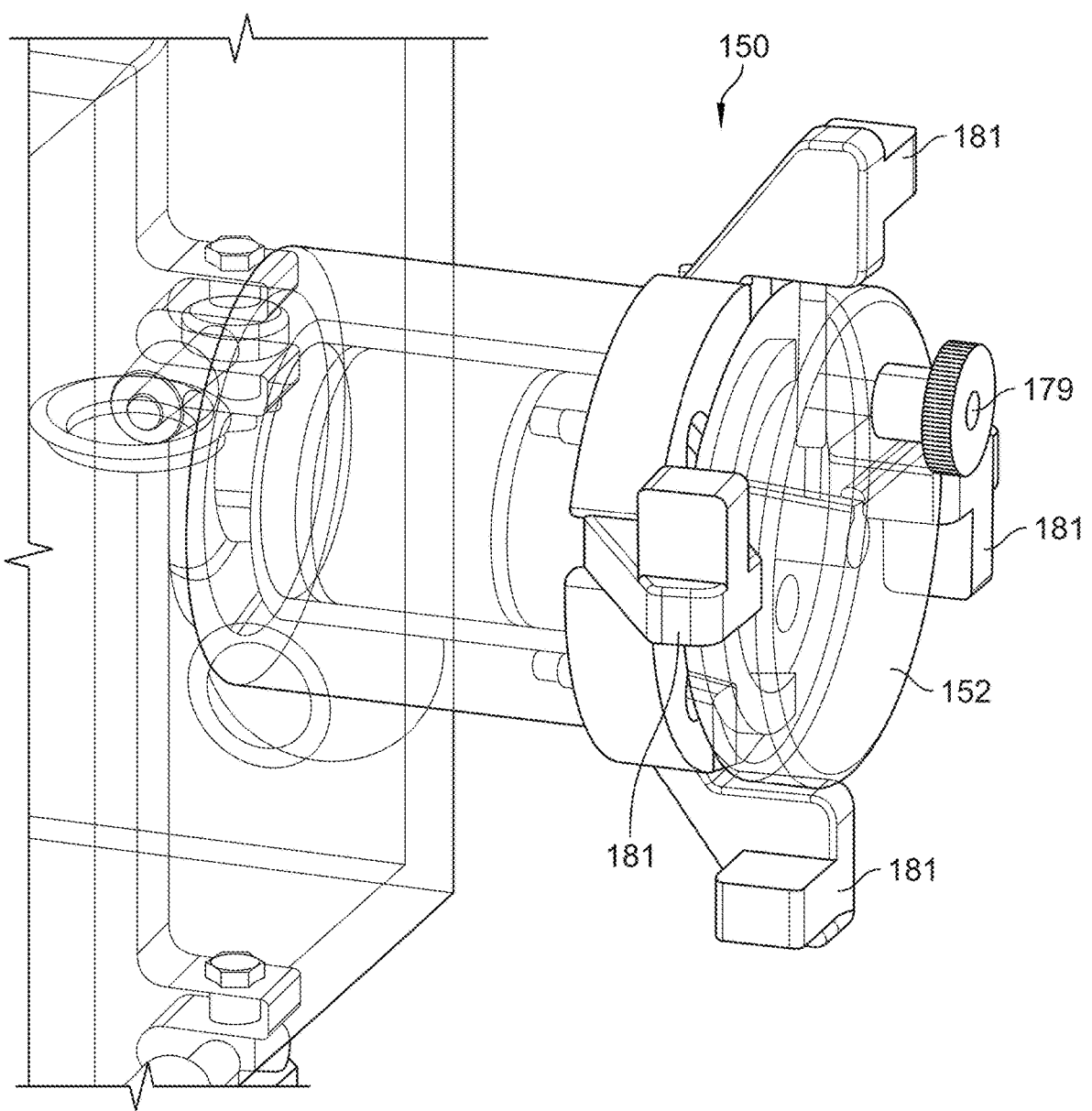
FIG. 33 is a rotation mechanism having stops for limiting rotation of the rotation mechanism to control addition of dopant batches.

The dopant feeder 164 includes a rotation mechanism 150 (FIG. 2). The rotation mechanism 159 includes a handle 152. The handle 152 includes a knob 179 (FIG. 33) that is biased with a spring pin (not shown) for an operator to rotate the first and second dopant receptacles 129, 131. A shaft 154 connects the handle 152 to a clamp 156. The shaft 154 extends through bearings 155 to enable the shaft 154 to rotate. The rotation mechanism may include a vacuum seal (e.g., magnetic coupling of the handle 152 to the shaft 154). The clamp 156 is releasably connected to a flange 123 of the dopant cup 137 (i.e., to remove the cup from the dopant feeder to load new batches of dopant).

As described further below, upon activation of the rotation mechanism 150 (e.g., by turning handle 152) the first and second dopant receptacles 129, 131 rotate to release the first and second batches of dopant 147, 149 into the crucible 104. The dopant feeder 164 includes a funnel 157 (FIG. 2) disposed below the dopant cup 137 and first and second dopant receptacles 129, 131 for collecting the first and second dopant batches 147, 149. The funnel 157 is connected to the dopant tube 130.

In the position of FIG. 4, first and second dopant batches 147, 149 are disposed within their respective receptacles 129, 131. The rotation mechanism 150 is actuated to rotate the dopant cup 137 and receptacles 129, 131 clockwise 90°

Figure 5:
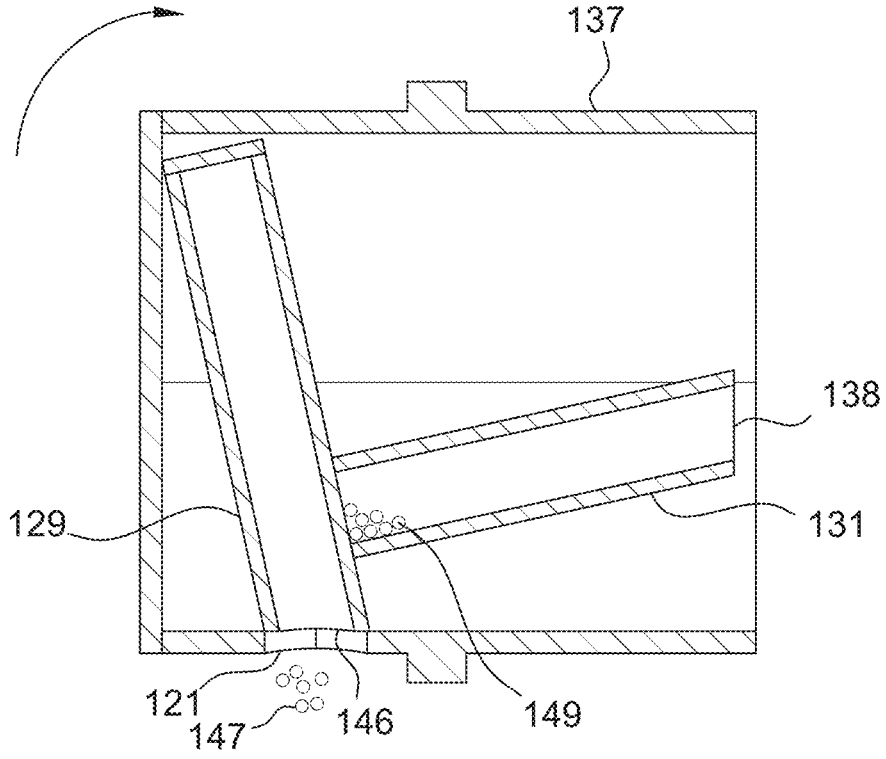
FIG. 5 is a cross-section view of the dopant feeder rotated 90° from the position of FIG. 4.

(FIG. 5) such that the first batch of dopant 147 falls through the first dopant receptacle 129 and through the receptacle outlet 146 and the first dopant receptacle opening 121. The batch of first dopant 147 falls into the funnel 157 (FIG. 2) and into the dopant tube 130 disposed below the dopant feeder 164 and falls to the crucible 104. The second batch of dopant 149 remains in the first dopant receptacle 131.

Figure 6:
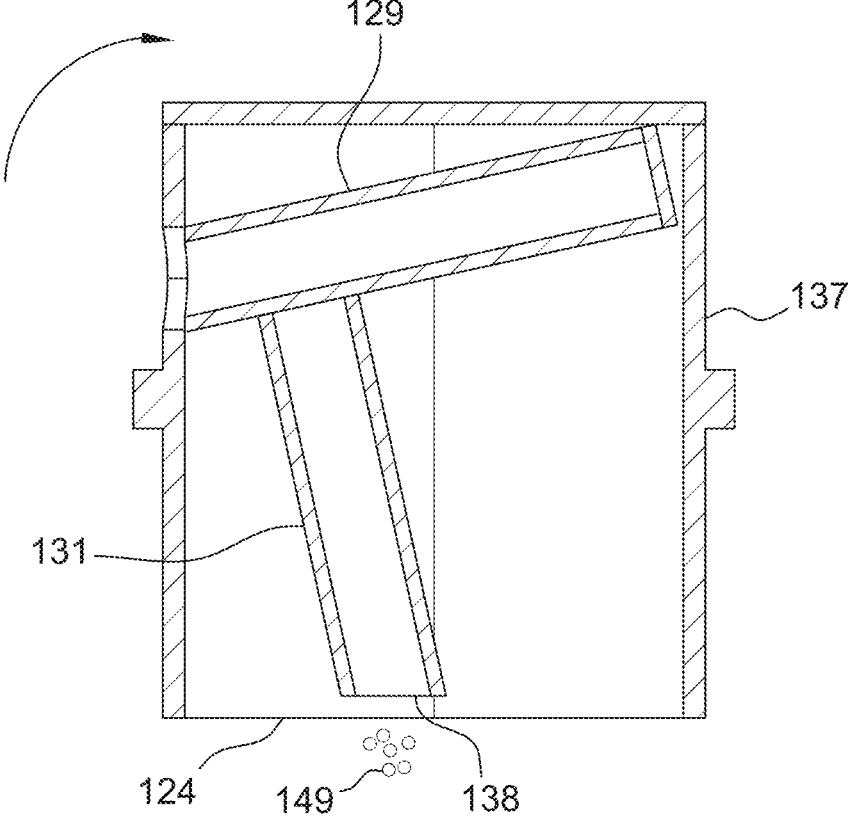
FIG. 6 is a cross-section view of the dopant feeder rotated 90° from the position of FIG. 5.
Figure 7:
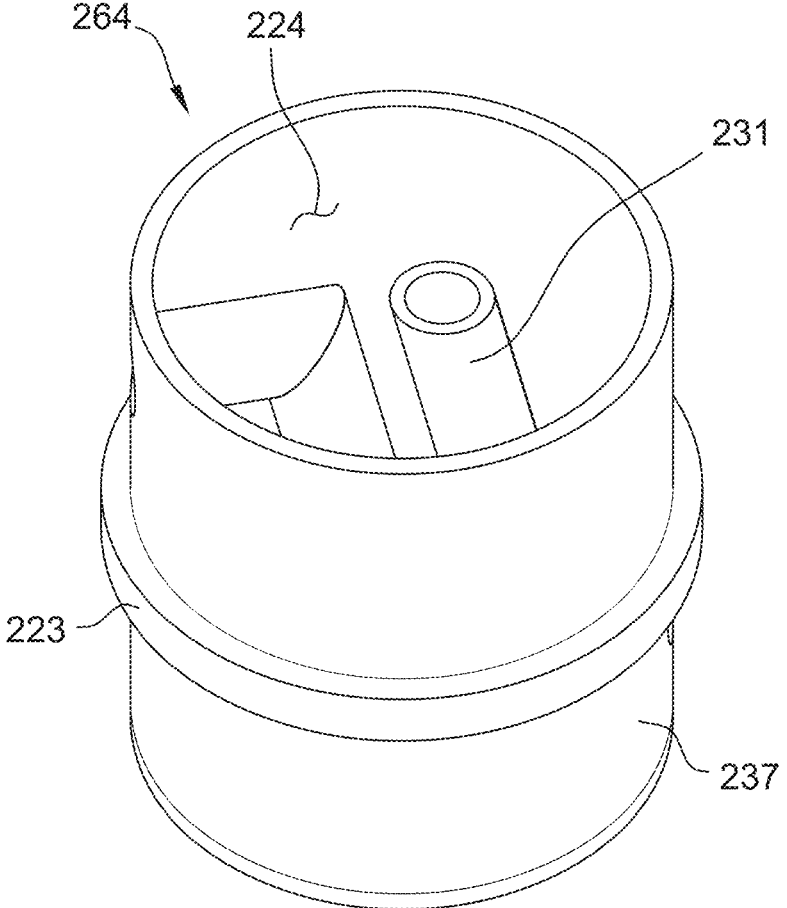
FIG. 7 is a perspective view of another embodiment of a dopant feeder that includes a dopant cup and three dopant receptacles disposed therein.
Figure 8:
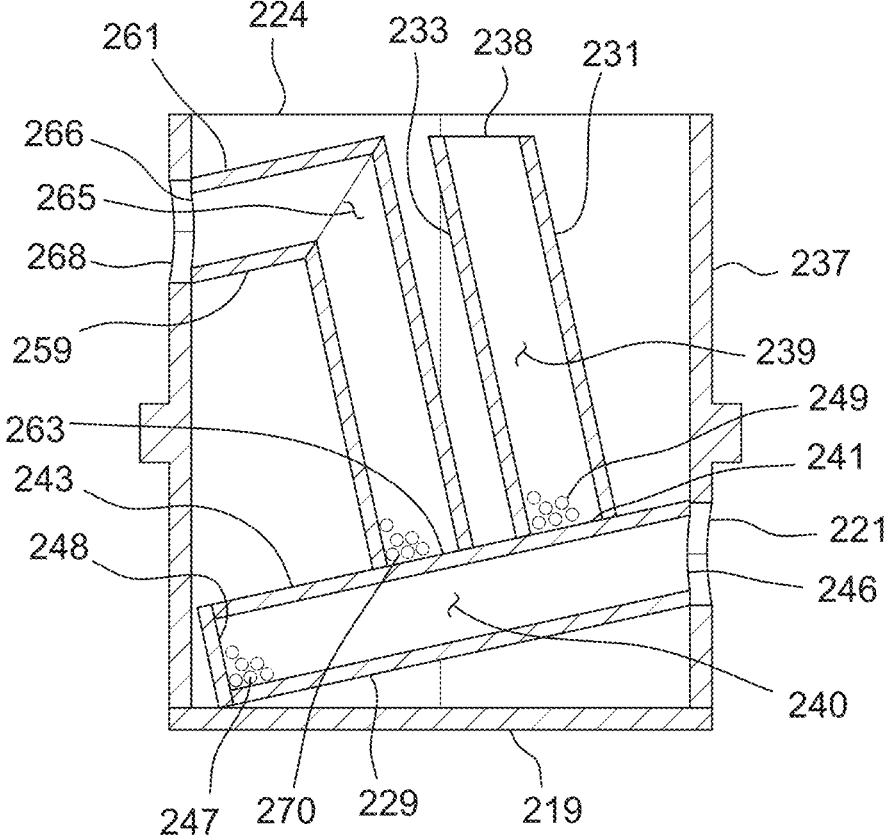
FIG. 8 is a cross-section view of the dopant feeder of FIG. 7 in an initial position.
Figure 9:
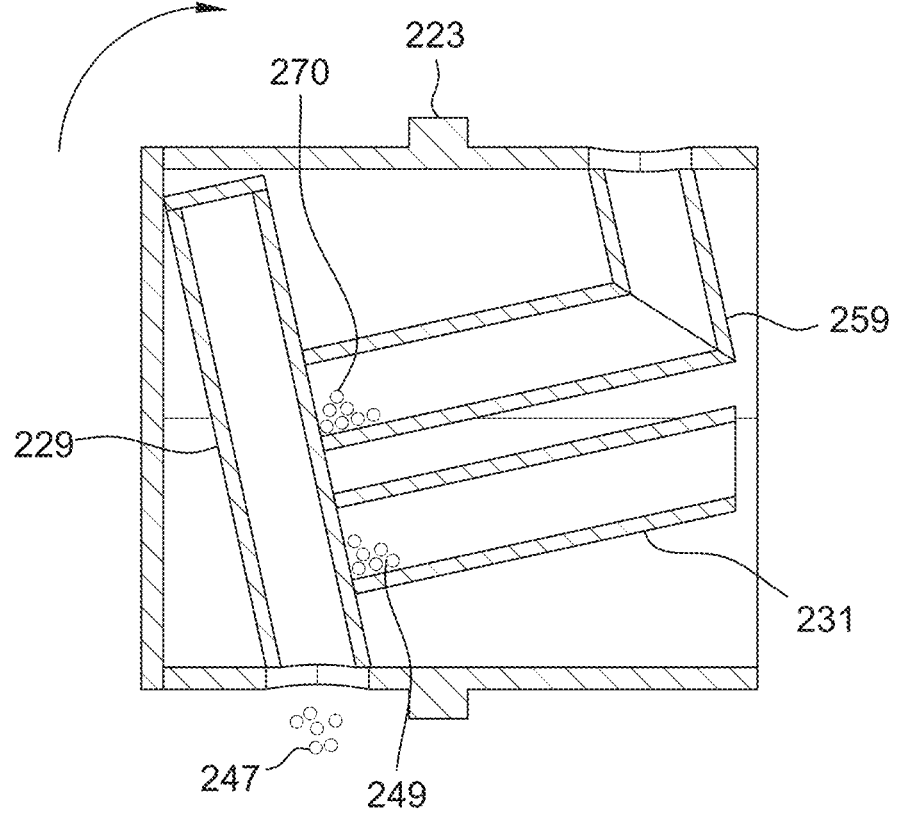
FIG. 9 is a cross-section view of the dopant feeder rotated 90° from the position of FIG. 8.
Figure 10:
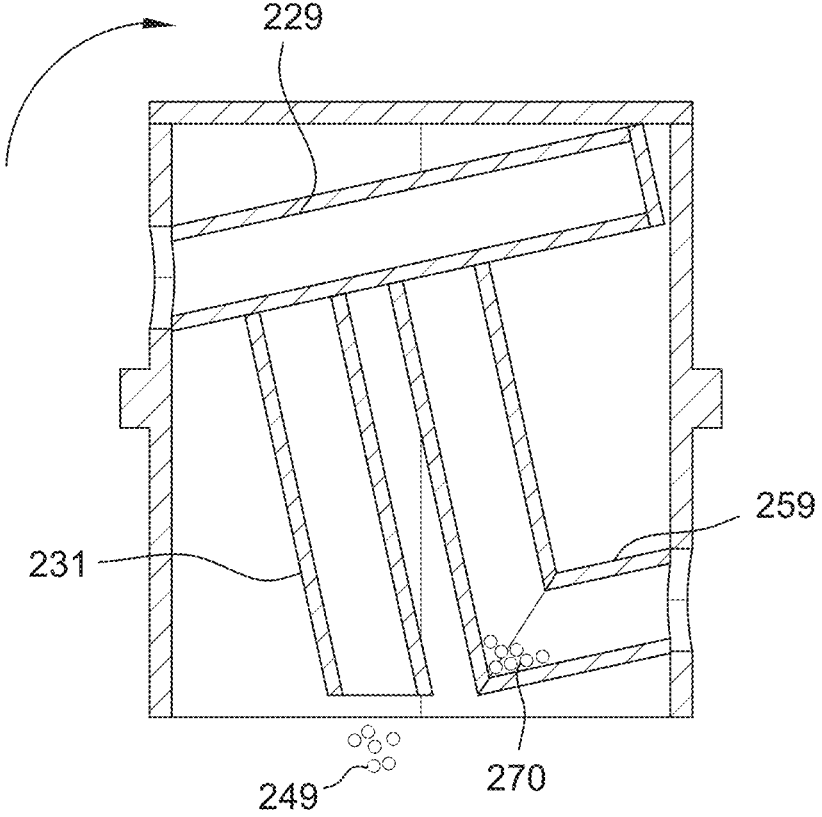
FIG. 10 is a cross-section view of the dopant feeder rotated 90° from the position of FIG. 9.
Figure 11:
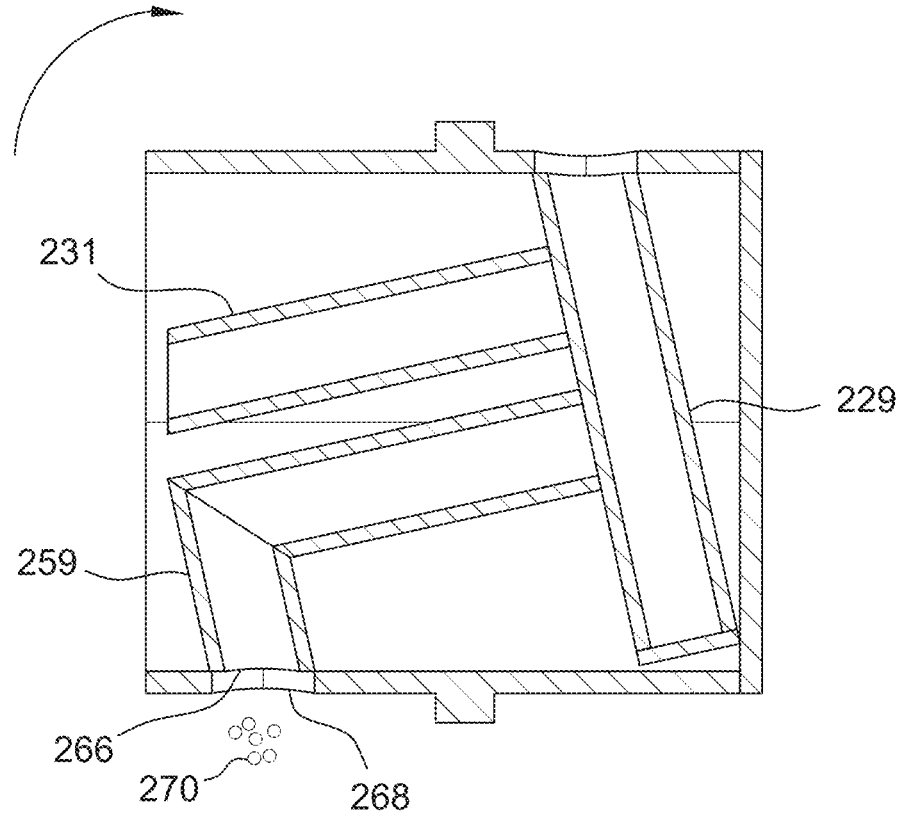
FIG. 11 is a cross-section view of the dopant feeder rotated 90° from the position of FIG. 10.
Figure 12:
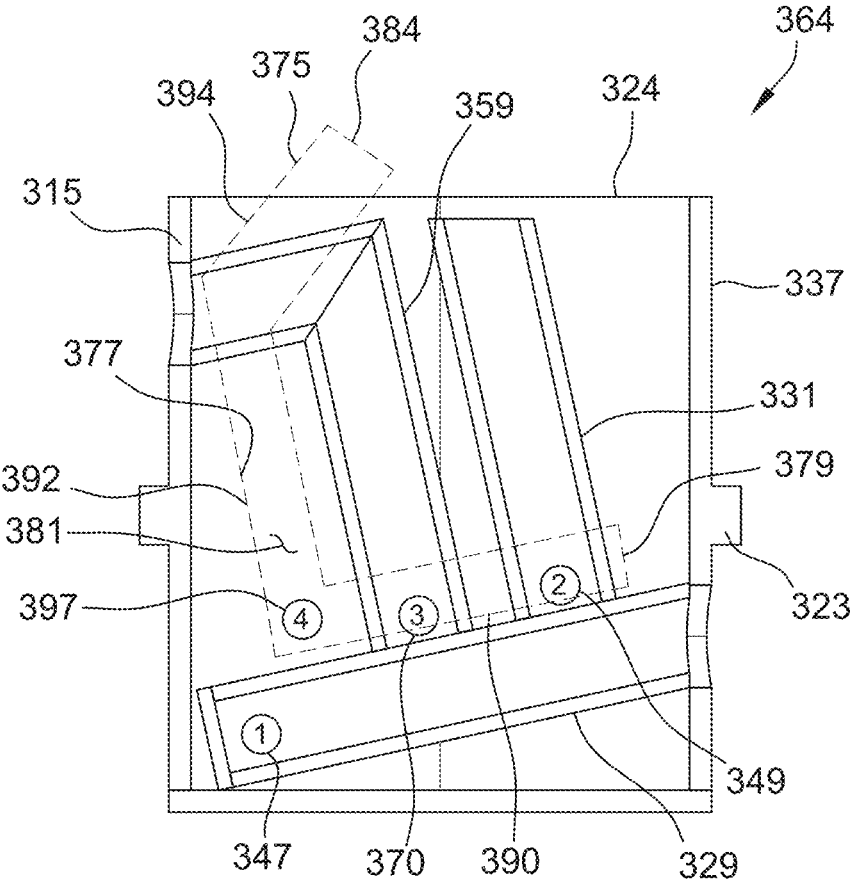
FIG. 12 is a cross-section view of another embodiment of a dopant feeder that includes a dopant cup and four dopant receptacles disposed therein in an initial position.
Figure 13:
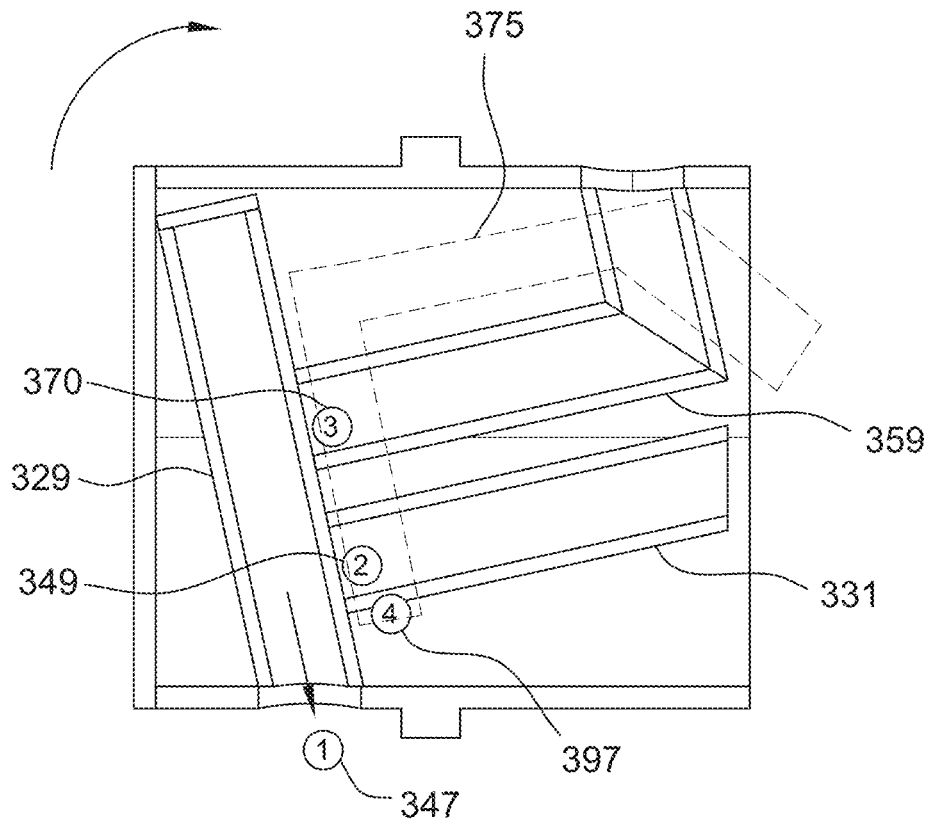
FIG. 13 is a cross-section view of the dopant feeder rotated 90° from the position of FIG. 12.
Figure 14:
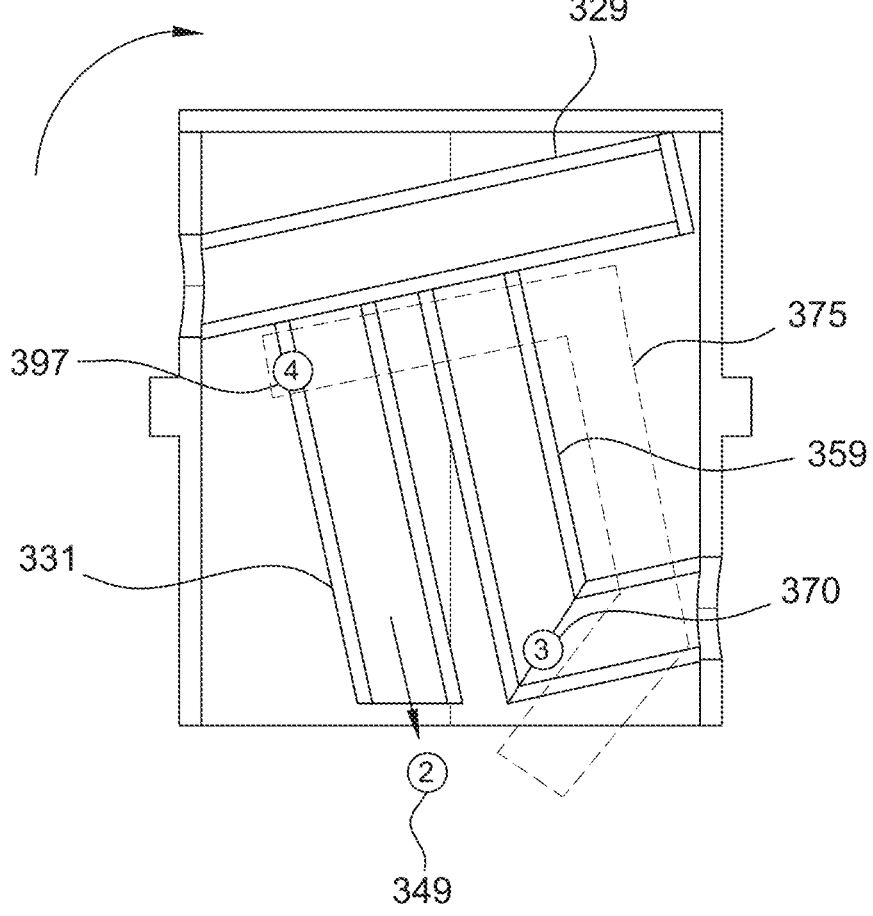
FIG. 14 is a cross-section view of the dopant feeder rotated 90° from the position of FIG. 13.
Figure 15:
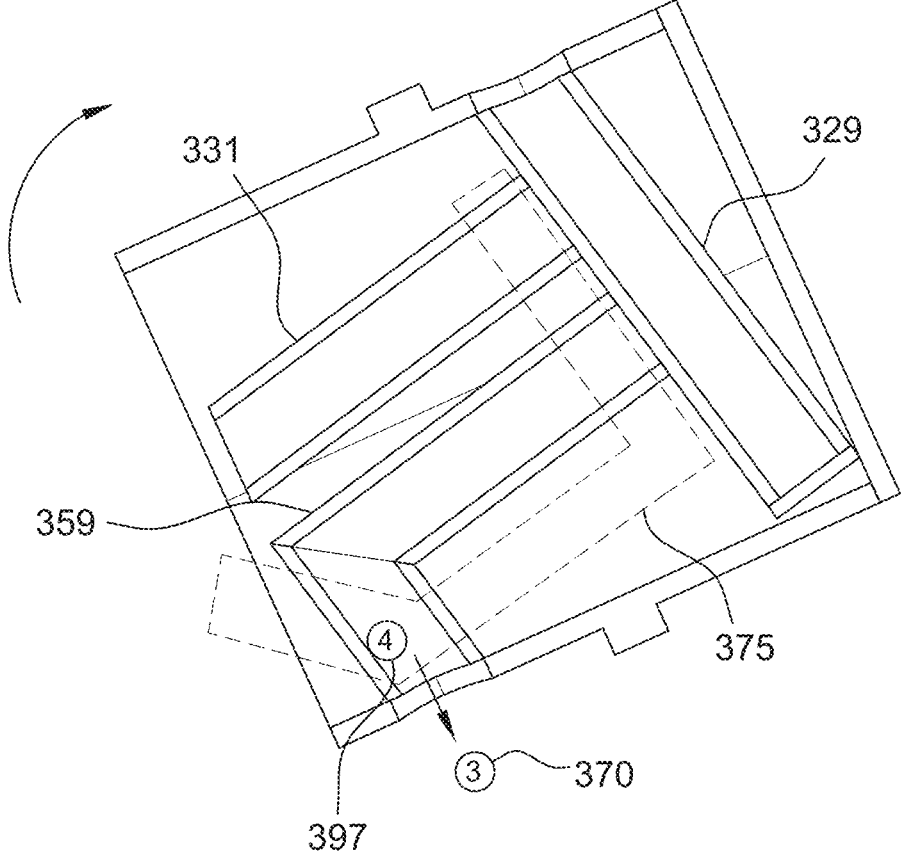
FIG. 15 is a cross-section view of the dopant feeder rotated 65° from the position of FIG. 14.

The rotation mechanism 150 is actuated again to rotate the dopant cup 137 and receptacles 129, 131 clockwise another 90° (FIG. 6) to cause the second batch of dopant 149 to fall through the second dopant receptacle 131 and through the receptacle outlet 138 and the second dopant receptacle opening 124. The batch of second dopant 149 falls into the funnel 157 (FIG. 2) and into the dopant tube 130 to transport the second batch of dopant 149 to the crucible 104.

It should be noted that the respective dopant batches may be released from the respective receptacles (in any of the embodiments described herein) before a full turn of the receptacle (i.e., before 90°, 180° and 270°), depending on how the receptacle is angled and the fluid/flow properties of the dopant.

Another embodiment of the dopant feeder 264 is shown in FIGS. 7-11. The components shown in FIGS. 7-11 that are analogous to those of FIGS. 3-6 are designated by the corresponding reference number of FIGS. 3-6 plus "100" (e.g., part 123 becomes 223). In addition to first and second dopant receptacles 229, 231, the dopant feeder 264 includes a third dopant receptacle 259. The third dopant receptacle 259 includes one or more sidewalls 261 and has a floor 263 (which is the sidewall of the first dopant receptacle 229) which define a second dopant receptacle inner chamber 265. The third receptacle 259 has an outlet 266 that is aligned with a third cup opening 268. In the illustrated embodiment, the third receptacle 259 is L-shaped.

The third dopant receptacle 259 holds a third batch of dopant 270. Once the dopant mechanism 250 is rotated through the points at which the first dopant batch 247 is discharged (FIG. 9) and the second dopant batch 249 is discharged (FIG. 10) and as it approaches the position shown in FIG. 11, the third dopant batch 270 is discharged through the outlet 266 and third cup opening 268.

Another embodiment of the dopant feeder is shown in FIGS. 12-16. The components shown in FIGS. 12-16 that are analogous to those of FIGS. 3-6 are designated by the corresponding reference number of FIGS. 3-6 plus "200" (e.g., part 123 becomes 323). In addition to first, second, and third dopant receptacles 329, 331, 359, the dopant feeder 364 includes a fourth dopant receptacle 375 (shown with dashed lines for illustration). The fourth dopant receptacle 375 includes one or more sidewalls 377 and has a first end or floor 379. The fourth dopant receptacle 375 includes a fourth dopant receptacle inner chamber 381. In the illustrated embodiment, the fourth receptacle 375 extends through the second opening 324 of the cup 337. In other embodiments, the fourth receptacle 375 is within the profile of the sidewall 315. The fourth receptacle 375 includes a fourth receptacle outlet 384. The fourth receptacle 375 includes three sections-a first section 390, second section 392, and third section 394. The second section 392 is disposed between the first and third sections 390, 394 and is angled relative to the first section 390 and the third section 394.

The fourth dopant receptacle 375 holds a fourth batch of dopant 397. Once the dopant mechanism is rotated through the points at which the first dopant batch 347 is discharged (FIG. 13), the second dopant batch 349 is discharged (FIG. 14), and the third batch of dopant 370 is discharged (FIG.

Figure 16:
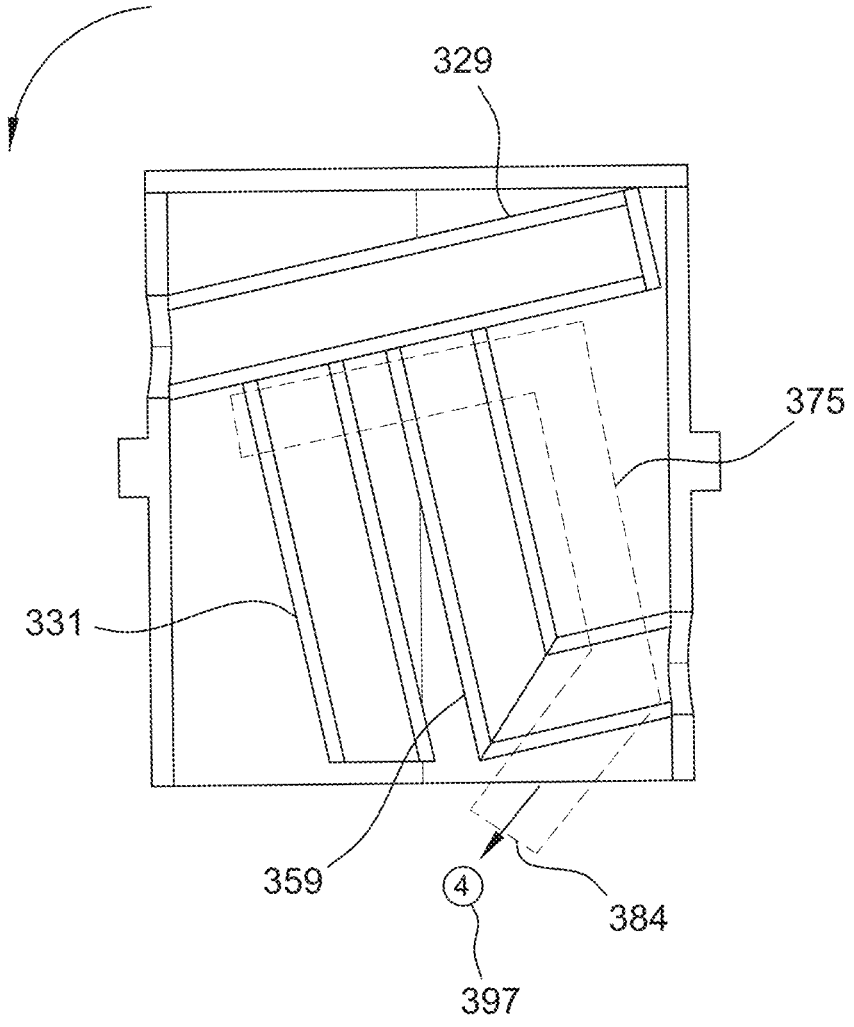
FIG. 16 is a cross-section view of the dopant feeder rotated back to the position of FIG. 14.

15), the dopant feeder is then reversed back to the position shown in FIG. 16 (corresponding to the position of FIG. 14) to discharge the fourth dopant batch 397 through the fourth receptacle outlet 384.

Figure 17:
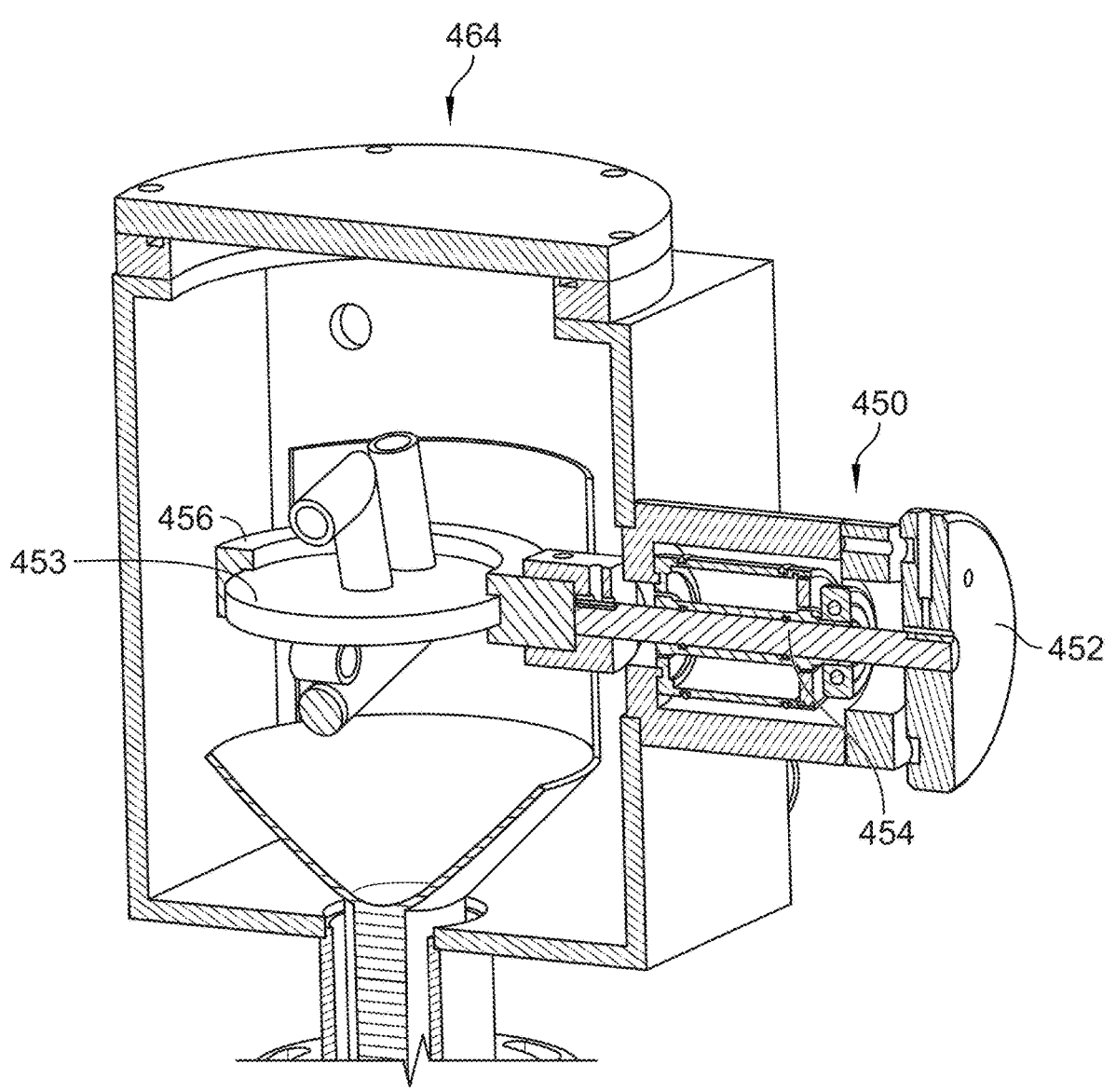
FIG. 17 is a perspective view of the dopant feed system having a dopant feeder with the dopant cup eliminate.
Figure 18:
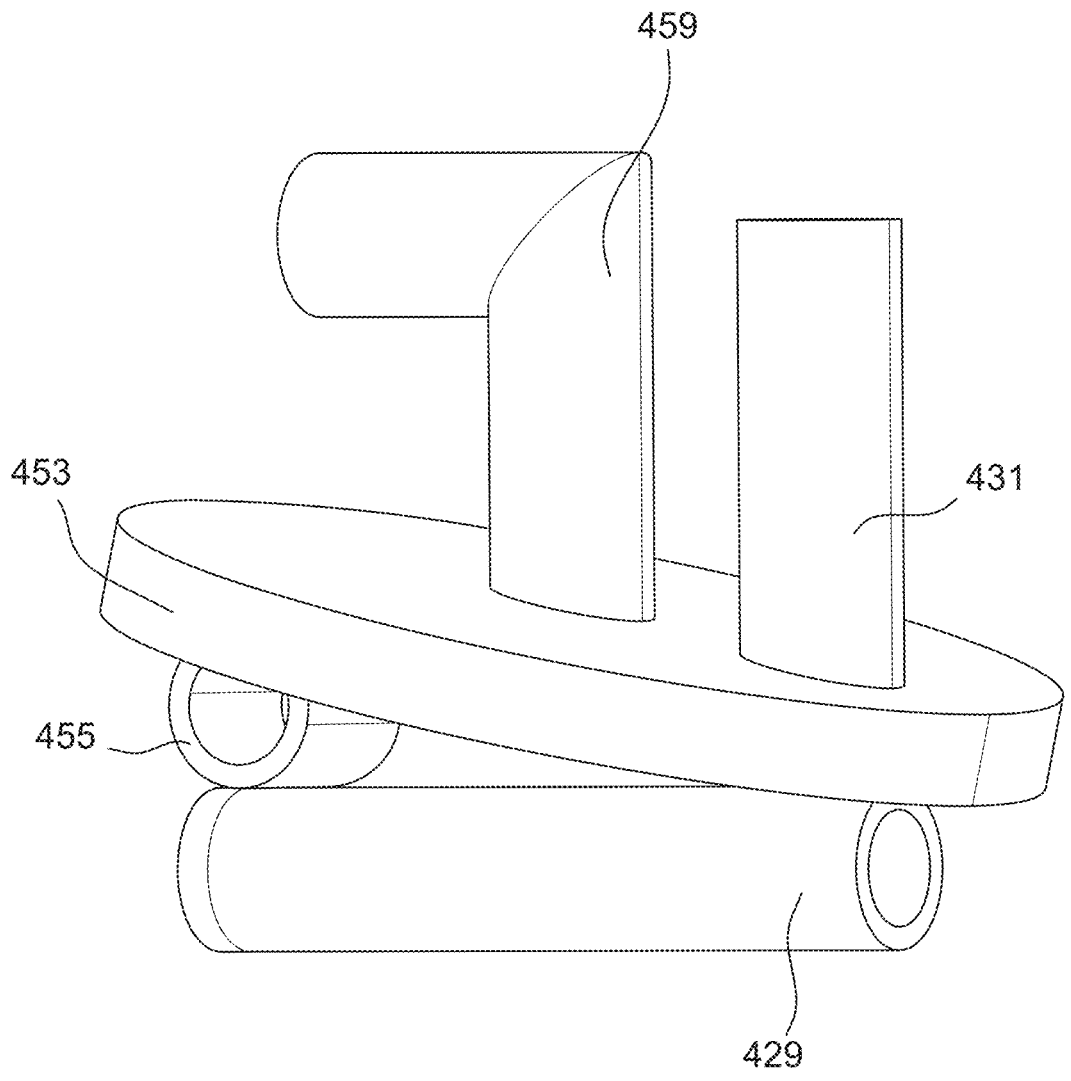
FIG. 18 is a side view of the dopant feeder of FIG. 17.
Figure 19:
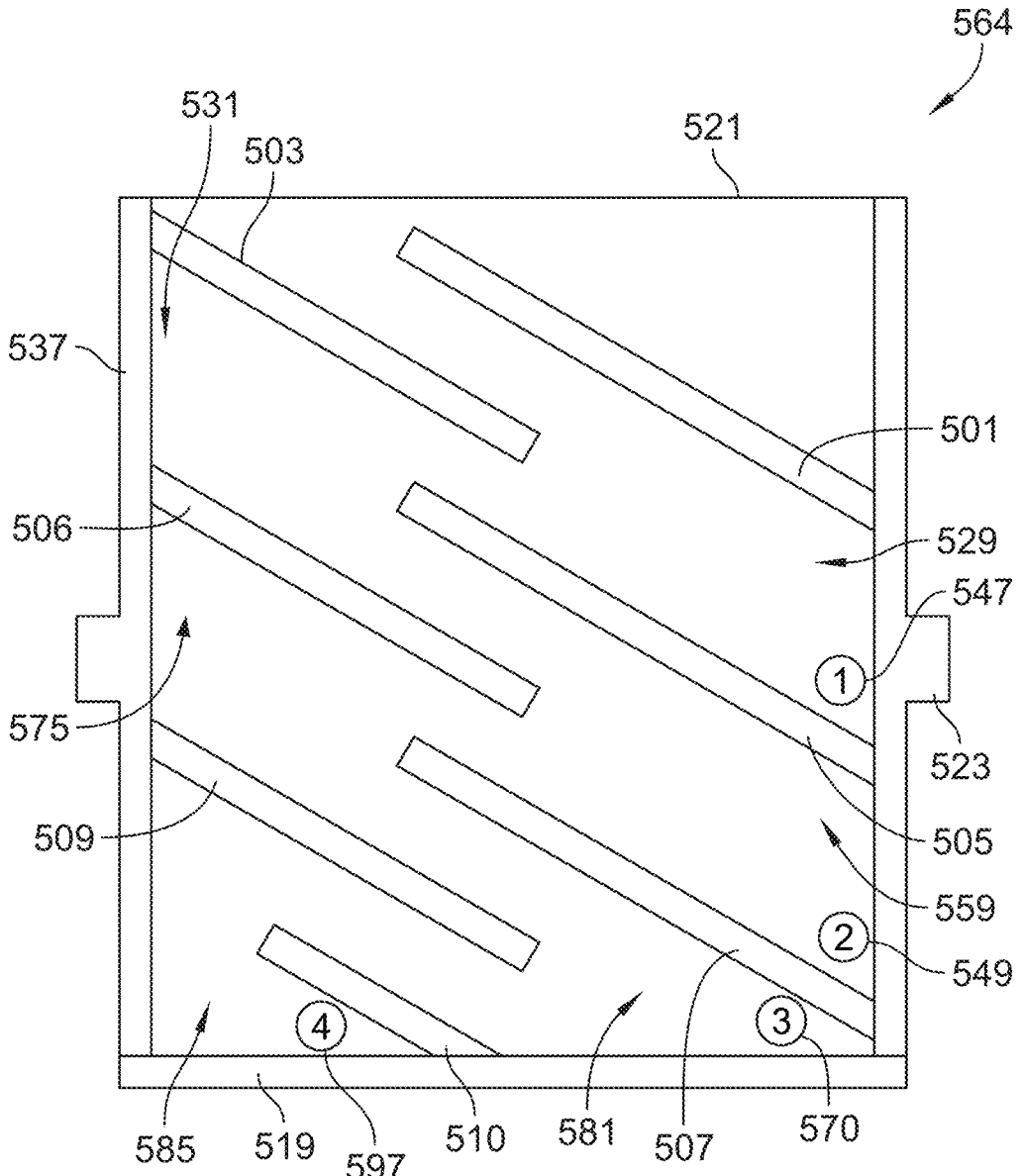
FIG. 19 is a cross-section view of another embodiment of a dopant feeder that includes a dopant cup having slats which define dopant receptacles.
Figure 20:
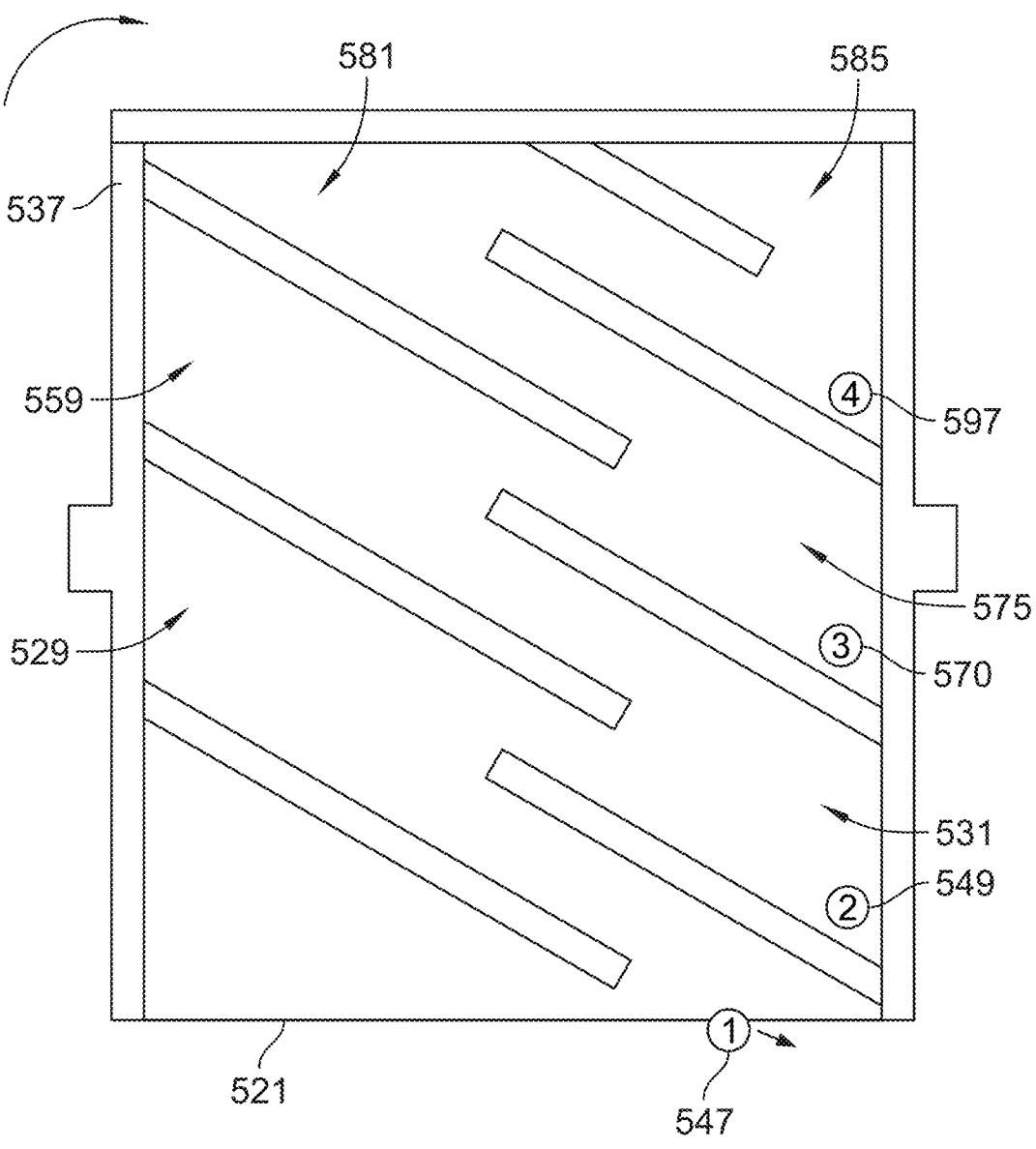
FIG. 20 is a cross-section view of the dopant feeder rotated 180° from the position of FIG. 19.
Figure 21:
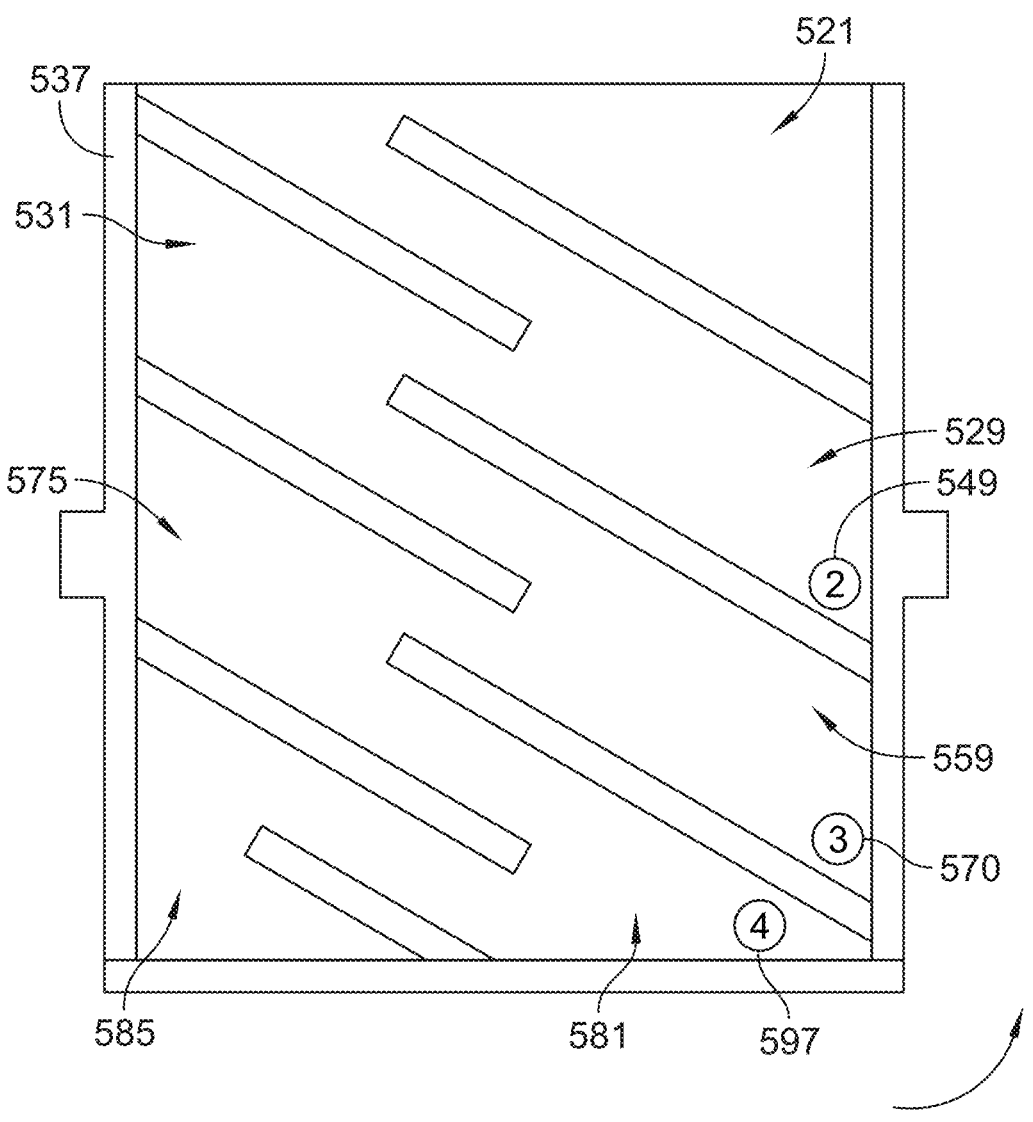
FIG. 21 is a cross-section view of the dopant feeder rotated 180° from the position of FIG. 20.
Figure 22:
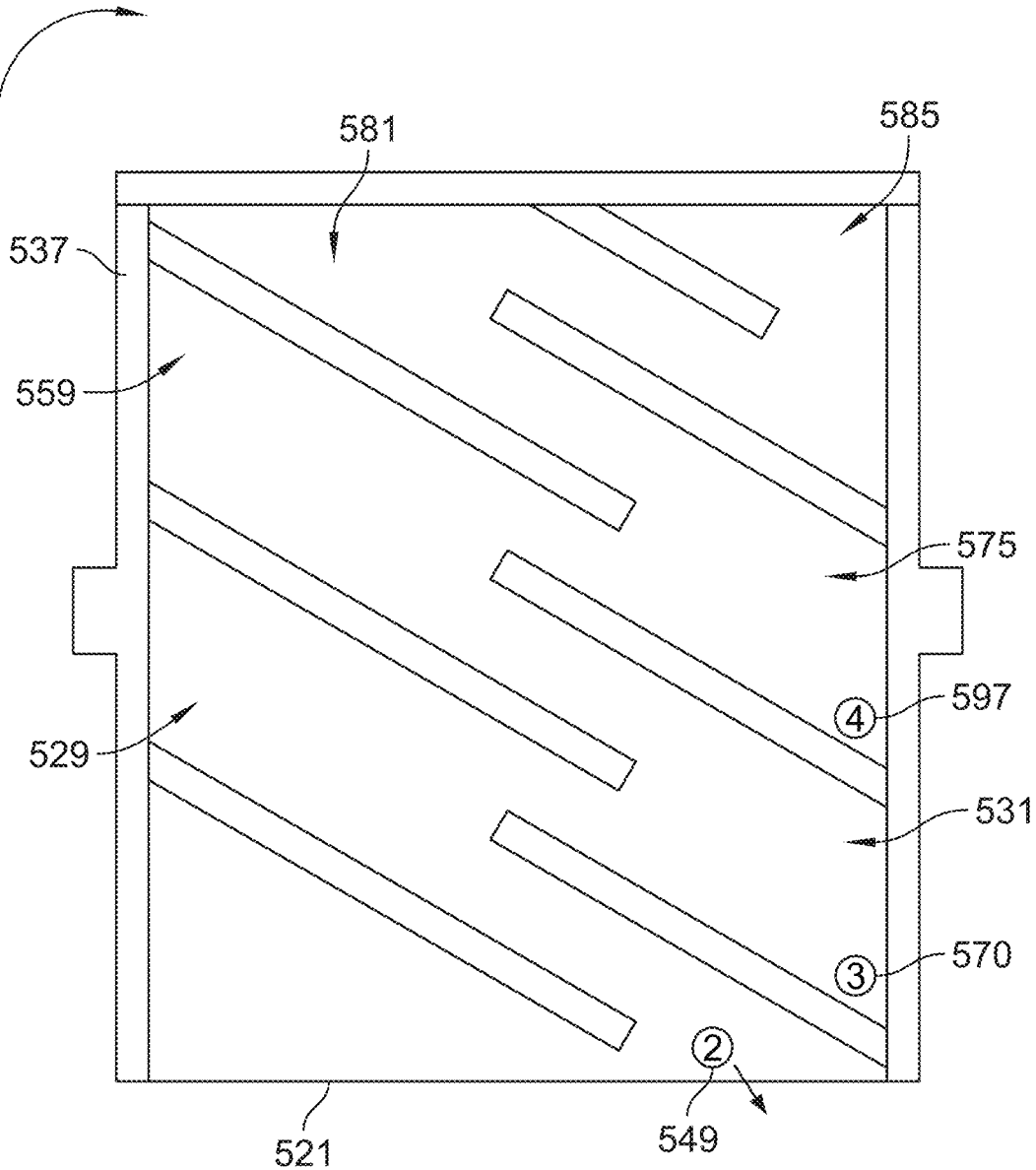
FIG. 22 is a cross-section view of the dopant feeder rotated 180° from the position of FIG. 21.
Figure 23:
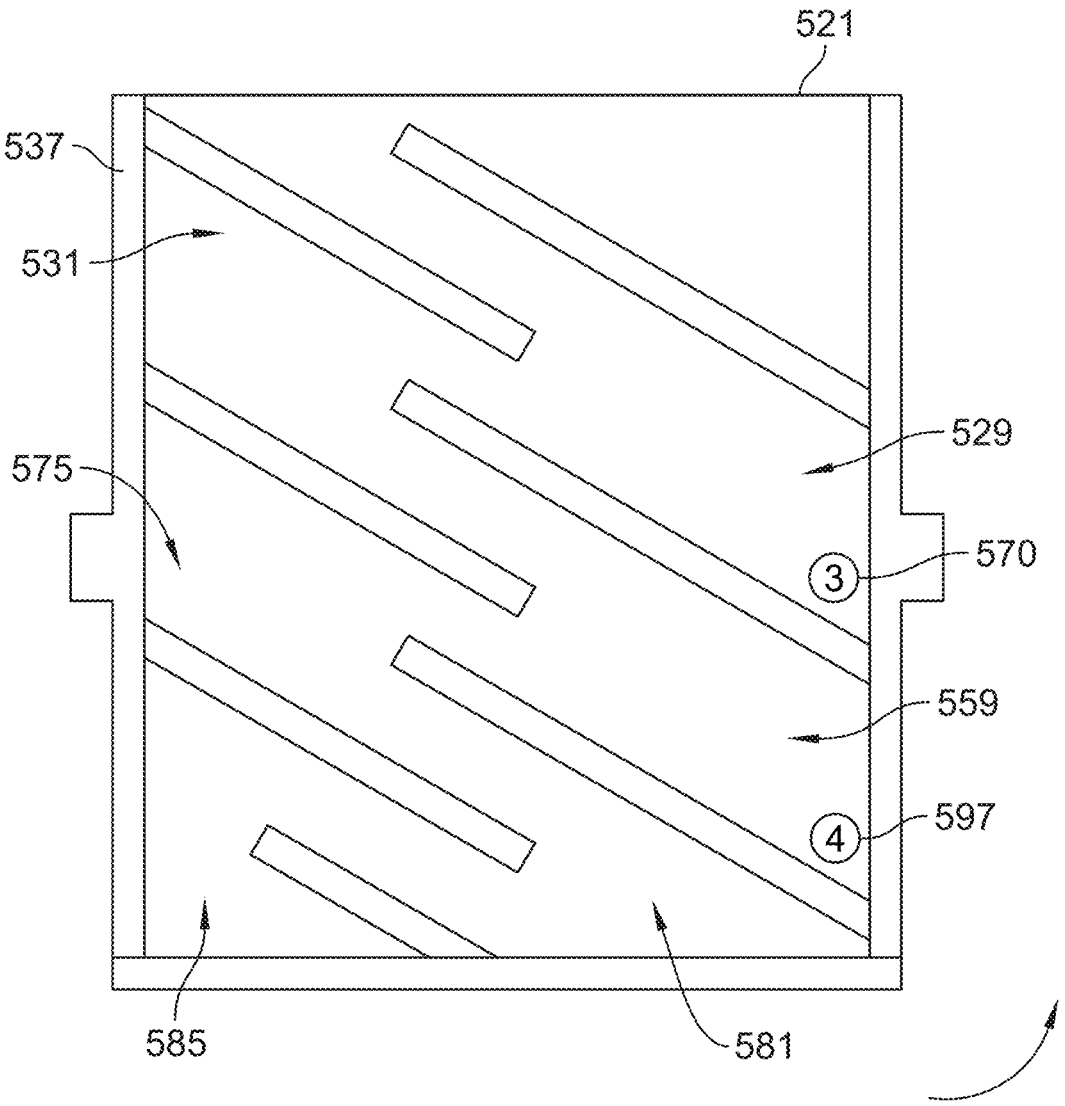
FIG. 23 is a cross-section view of the dopant feeder rotated 180° from the position of FIG. 22.
Figure 24:
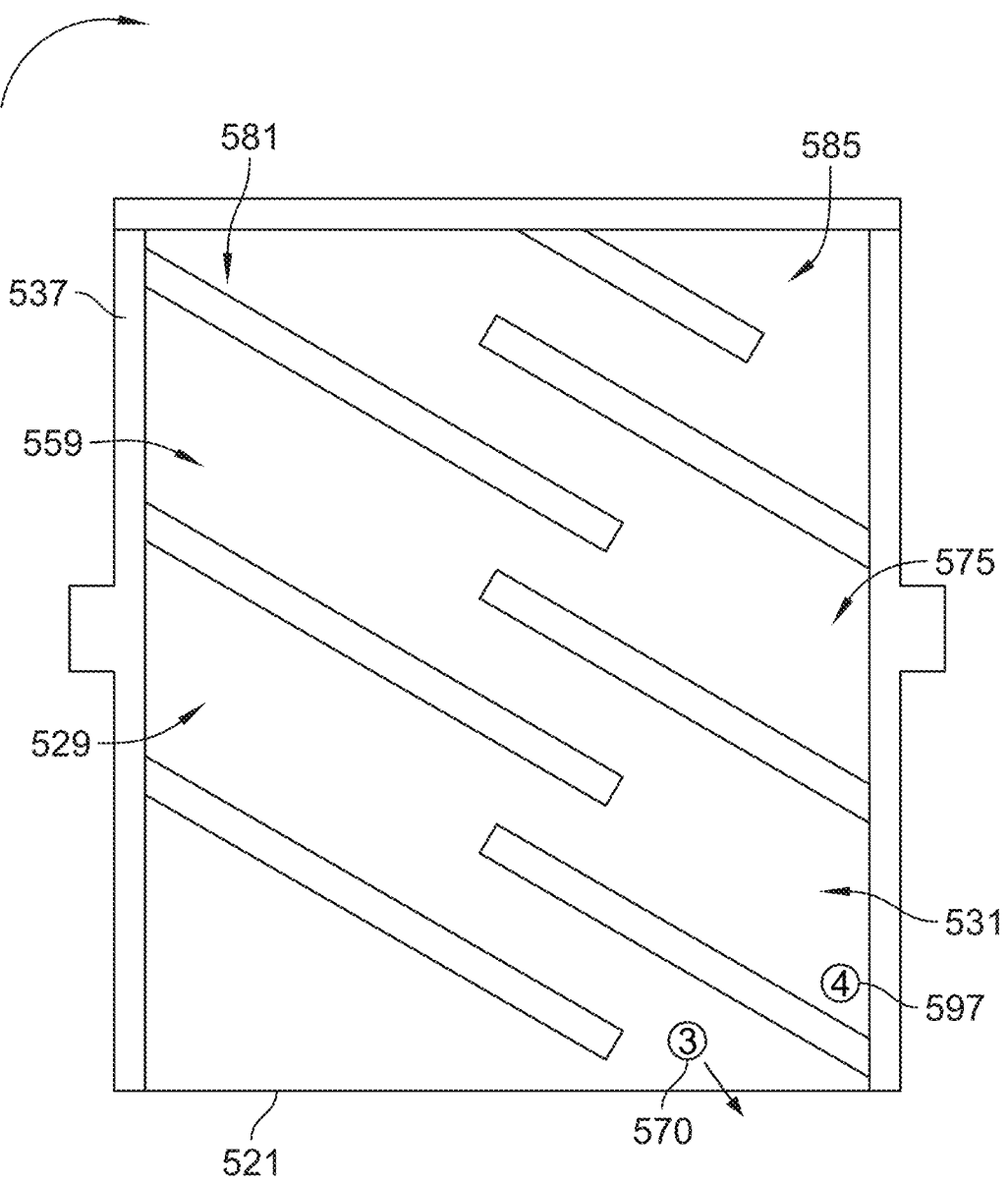
FIG. 24 is a cross-section view of the dopant feeder rotated 180° from the position of FIG. 23.
Figure 25:
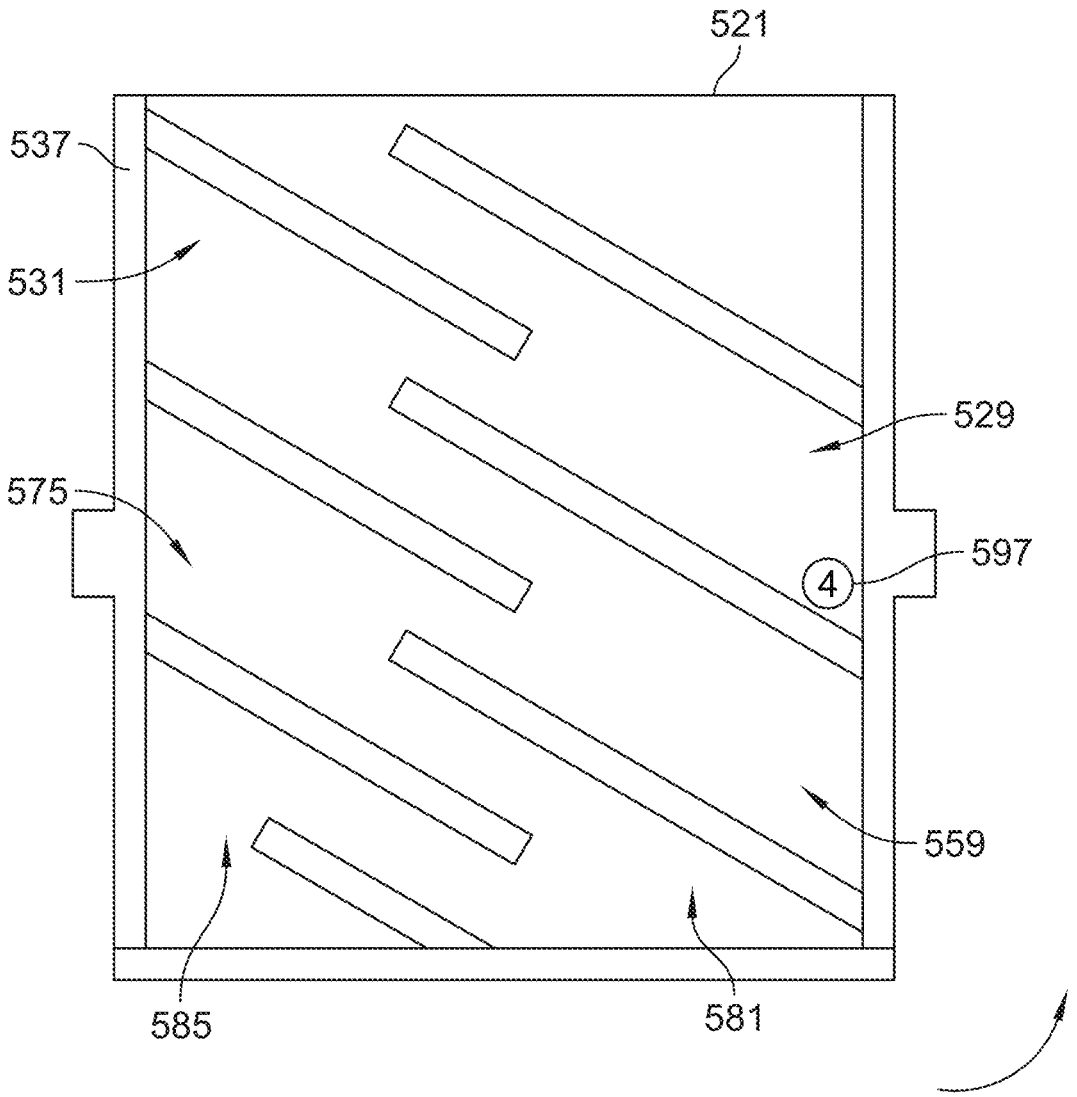
FIG. 25 is a cross-section view of the dopant feeder rotated 180° from the position of FIG. 24.

In some embodiments and as shown in FIGS. 17-18, the dopant cup may be eliminated. The components shown in FIGS. 17-18 that are analogous to those of FIGS. 3-6 are designated by the corresponding reference number of FIGS. 3-6 plus "300" (e.g., part 123 becomes 423). The dopant feeder 464 includes first, second, and third dopant receptacles 429, 431, 459. The receptacles 429, 431, 459 are connected to a disk 453. The disk 453 is angled by use of a spacer 455 disposed between the disk 453. The disk 453 is connected to the clamp 456 for rotation by the rotation mechanism 450.

Referring now to FIGS. 19-27, the dopant feeder 564 includes a plurality of slats 501, 503, 505, 506, 507, 509, 510 disposed in a dopant cup 537. The components shown in FIGS. 19-27 that are analogous to those of FIGS. 3-6 are designated by the corresponding reference number of FIGS. 3-6 plus "400" (e.g., part 123 becomes 523). The illustrated embodiment of the feeder 564 includes 7 slats. Other embodiments may include more or less slats such as 2, 3, 4, 5, 6 or 8 or more slats. Adjacent slats may form dopant receptacles that hold dopant as the cup 537 rotates. For example, the first slat 501 and the third slat 505 form a first dopant receptacle 529. The second slat 503 and the fourth slat 505 form a second dopant receptacle 531. The third slat 505 and the fifth slat 507 form a third dopant receptacle 559. The fourth slat 506 and the sixth slat 509 form a fourth dopant receptacle 575. The fifth slat 507, seventh slat 510 and dopant cup floor 519 form a fifth dopant receptacle 581. The sixth slat 509, seventh slat 510 and dopant cup floor 519 form a sixth dopant receptacle 585.

In its initial loaded state, the dopant cup 537 includes a first batch of dopant 547 in the first dopant receptacle 529, a second batch of dopant 549 in the third dopant receptacle 559, a third batch of dopant 570 in the fifth dopant receptacle 581, and a fourth batch of dopant 597 in the sixth dopant receptacle 585. As the dopant cup 537 rotates clockwise, the first batch of dopant 547 is released from the cup 537 (FIG. 20) through the opening 521. The second batch of dopant 549 moves from the third dopant receptacle 559 to the second dopant receptacle 531. The third batch of dopant 570 moves from the fifth dopant receptacle 581 to the fourth dopant receptacle 575. The fourth batch of dopant 597 changes its position within the sixth dopant receptacle 585 during this first stage of rotation.

Upon counter-clockwise rotation of the cup 537 to its initial position (FIG. 21), the second batch of dopant 549 moves from the second dopant receptacle 531 to the first dopant receptacle 529. The third batch of dopant 570 moves from the fourth dopant receptacle 575 to the third dopant receptacle 559. The fourth batch of dopant 597 moves from the sixth dopant receptacle 585 to the fifth dopant receptacle 581.

As the dopant cup 537 is rotated back clockwise, the batch of second dopant 549 is released from the cup 537 (FIG. 22) through the opening 521. The third batch of dopant 570 moves to the second dopant receptacle 531 and the fourth batch 597 moves to the forth dopant receptacle 575. As the dopant cup 537 rotates counter-clockwise to its initial position (FIG. 23), the third batch of dopant 570 moves to the first dopant receptacle 529 and the fourth batch 597 moves to the third dopant receptacle 559.

Figure 26:
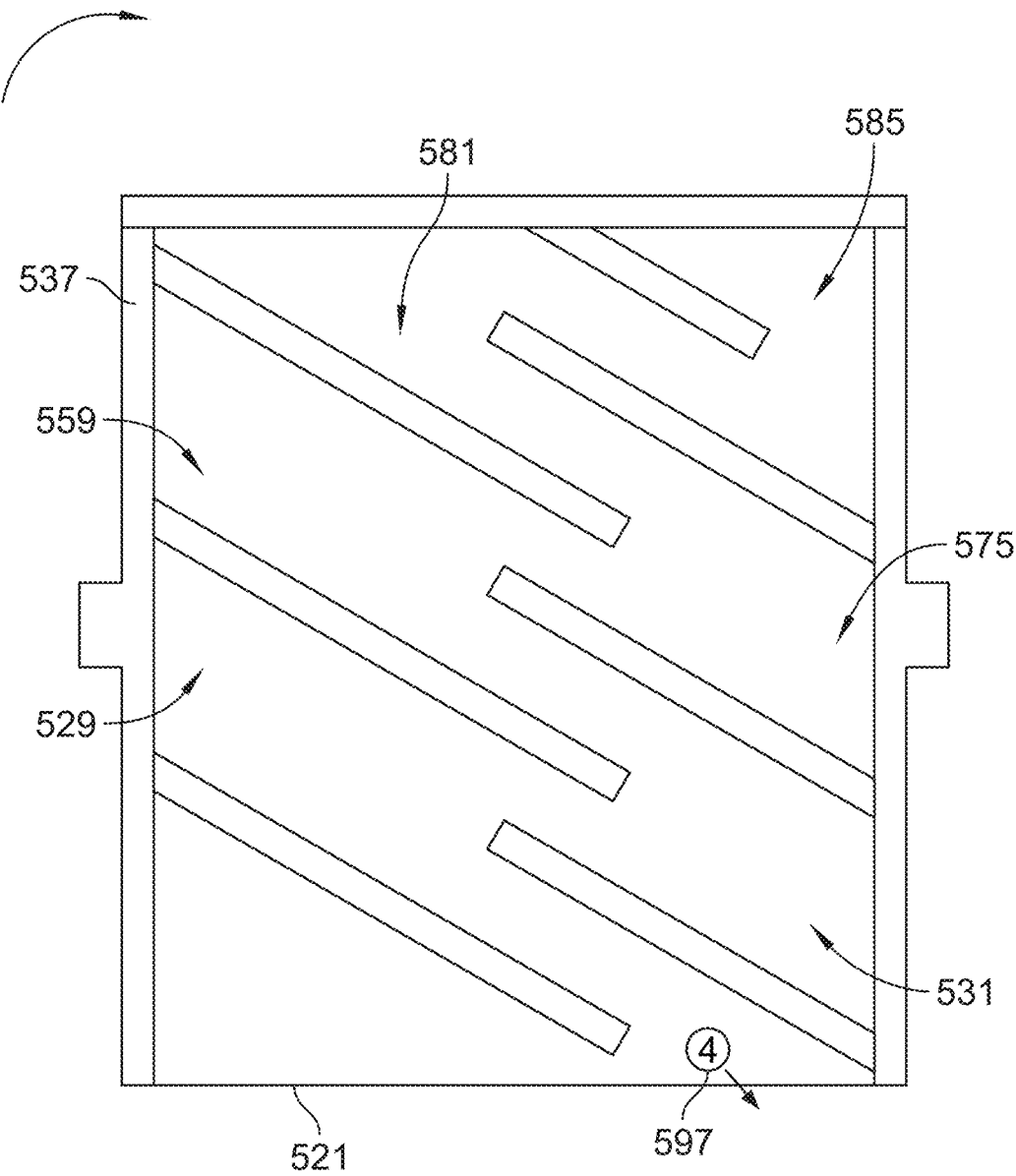
FIG. 26 is a cross-section view of the dopant feeder rotated 180° from the position of FIG. 25.
Figure 27:
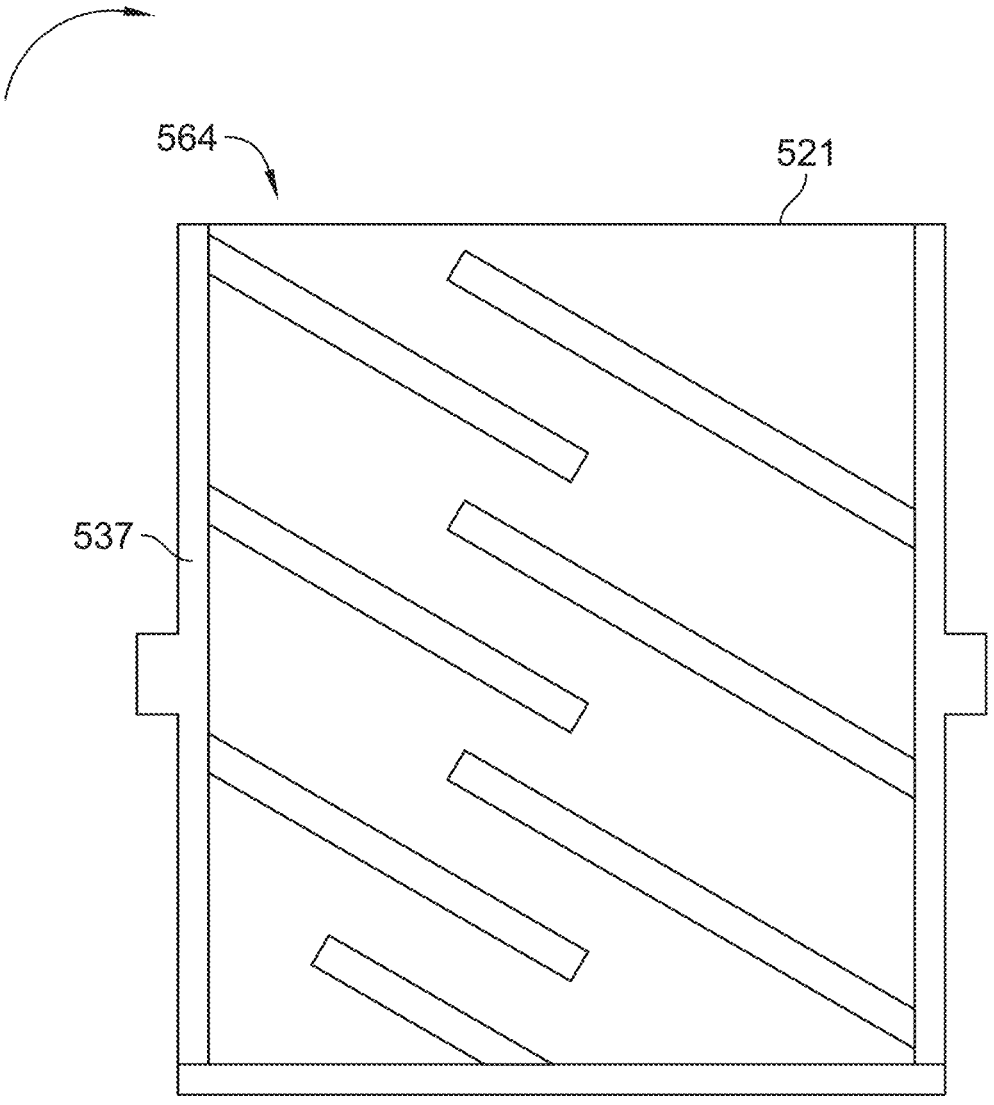
FIG. 27 is a cross-section view of the dopant feeder rotated 180° from the position of FIG. 26.

The dopant cup 537 may be rotated clockwise a third time (FIG. 24) to release the batch of third dopant 570 and to move the fourth batch of dopant 597 to the second dopant receptacle 531. As the dopant cup rotates counter-clockwise back to its initial position (FIG. 25), the batch of fourth dopant 597 moves to the first dopant receptacle 529. Upon rotation of the dopant cup clockwise for a fourth time, the fourth dopant batch 597 is released from the cup (FIG. 26).

Figure 28:
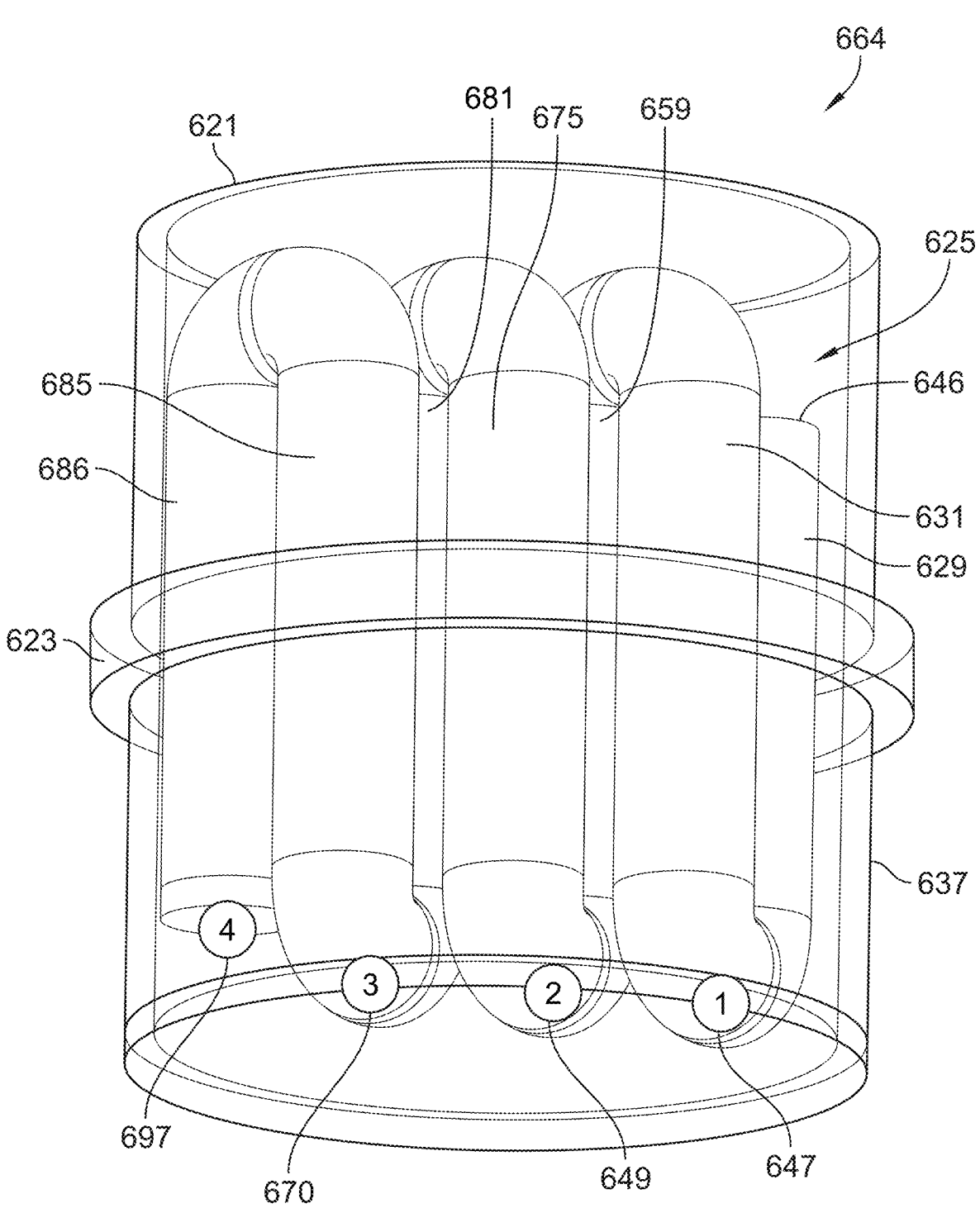
FIG. 28 is a perspective view of another embodiment of a dopant feeder that includes a dopant cup having a serpentine tube which defines dopant receptacles.
Figure 29:
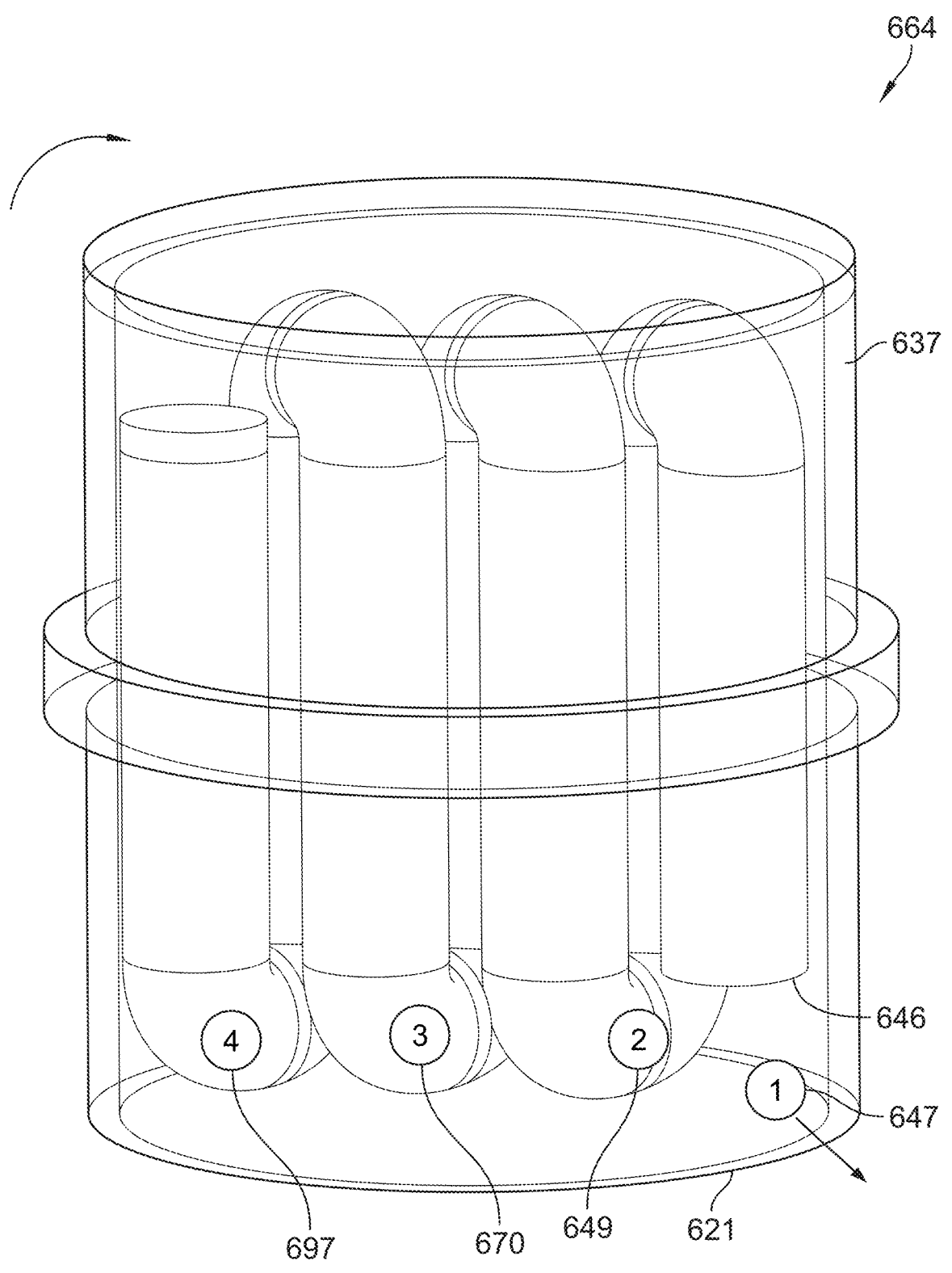
FIG. 29 is a perspective view of the dopant feeder rotated 180° from the position of FIG. 28.
Figure 30:
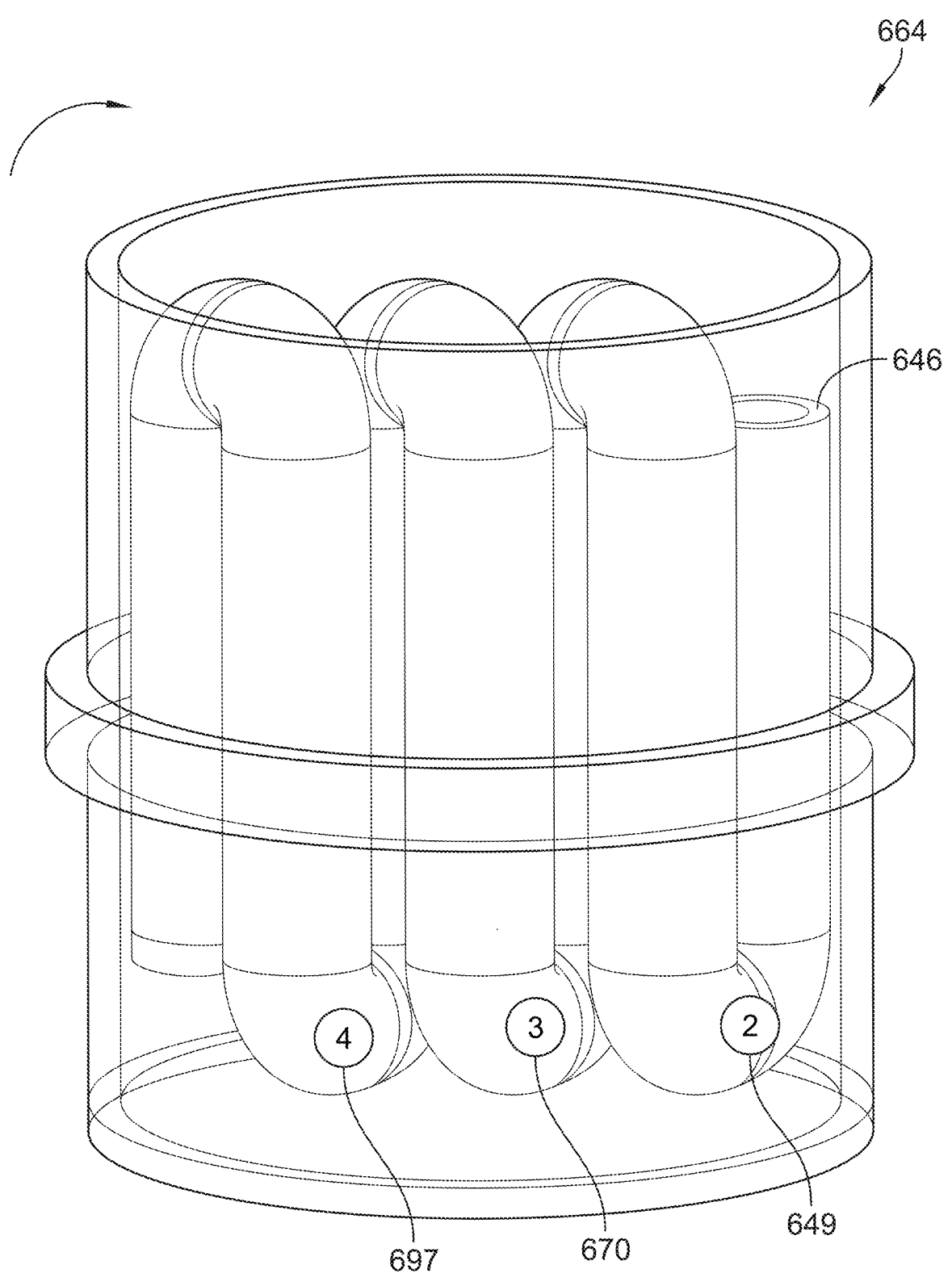
FIG. 30 is a perspective view of the dopant feeder rotated 180° from the position of FIG. 29.

Another embodiment of the dopant feeder 664 is shown in FIGS. 28-30. The components shown in FIGS. 28-30 that are analogous to those of FIGS. 3-6 are designated by the corresponding reference number of FIGS. 3-6 plus "500" (e.g., part 123 becomes 623). The dopant feeder 664 includes a serpentine tube 625 that has a plurality of turns (i.e., parallel tube sections which may also be referred to as "dopant receptacles") for holding and moving dopant. In the illustrated embodiment, the dopant feeder 664 includes a first dopant receptacle 629, second dopant receptacle 631, third dopant receptacle 659, fourth dopant receptacle 675, fifth dopant receptacle 681, sixth dopant receptacle 685, and seventh dopant receptacle 686. First, second, third and fourth batches of dopant 647, 649, 670, 697 are disposed at the bottom of the tube 625 between respective tube sections. As the dopant cup 637 rotates 180°, the batch of first dopant 647 is discharged through the outlet 646 of the first dopant receptacle 629 and through the dopant cup opening 621. During rotation, the second, third and fourth batches 649, 670, 697 move to the next respective receptacle. Rotation continues until the remaining batches 649, 670, 697 are discharged through the outlet 646 and from the dopant cup 637.

Figure 31:
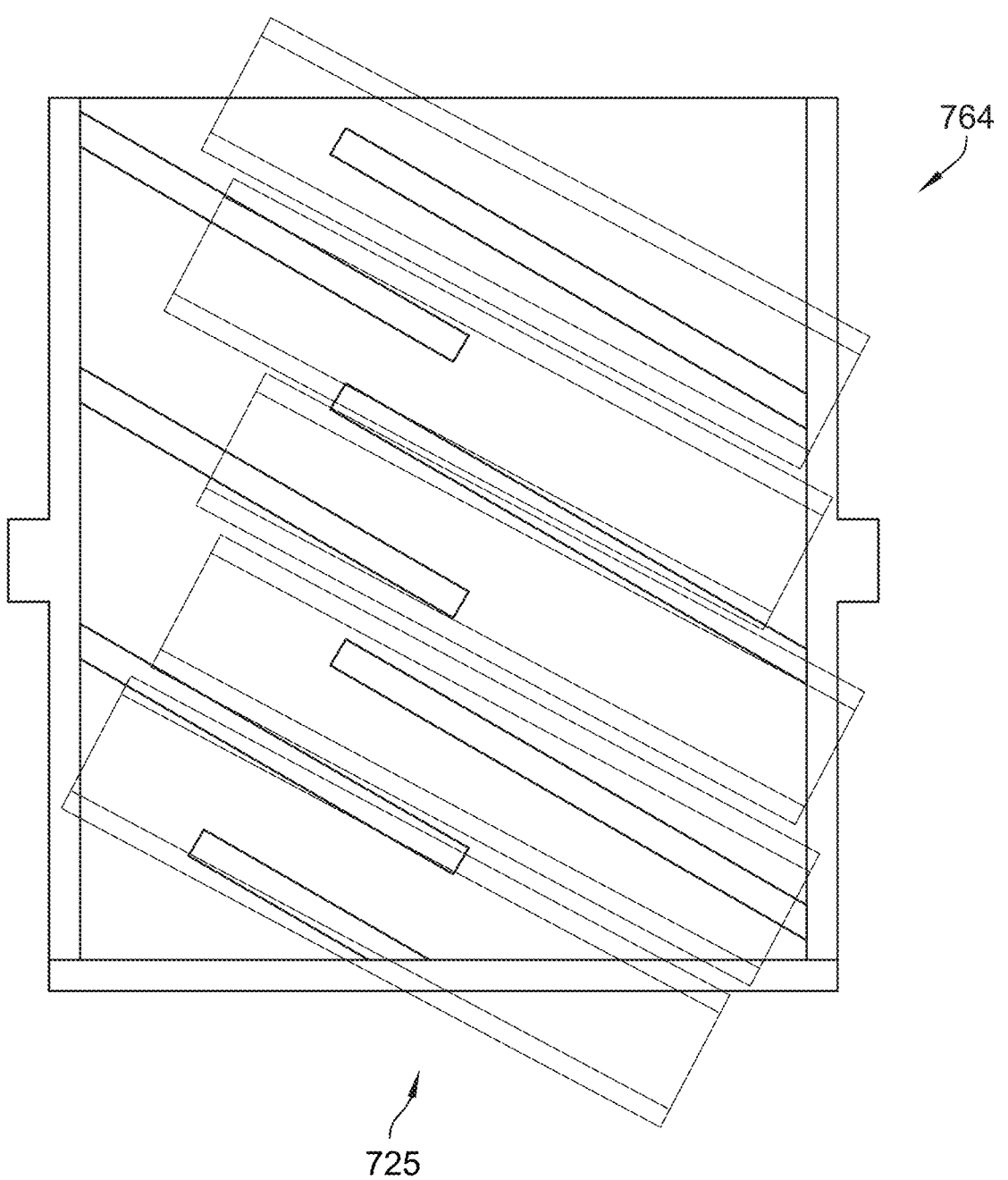
FIG. 31 is a cross-section view of another embodiment of a dopant feeder with a dopant cup having a serpentine tube offset from the tube shown in FIGS. 28-30.

Another embodiment of the dopant feeder 764 is shown in FIG. 31. The dopant feeder 764 is corresponds to the dopant feeder shown in FIGS. 28-30 with the serpentine tube 725 being offset from the position of the tube 625 shown in FIGS. 28-30 (i.e., rotated).

Figure 32:
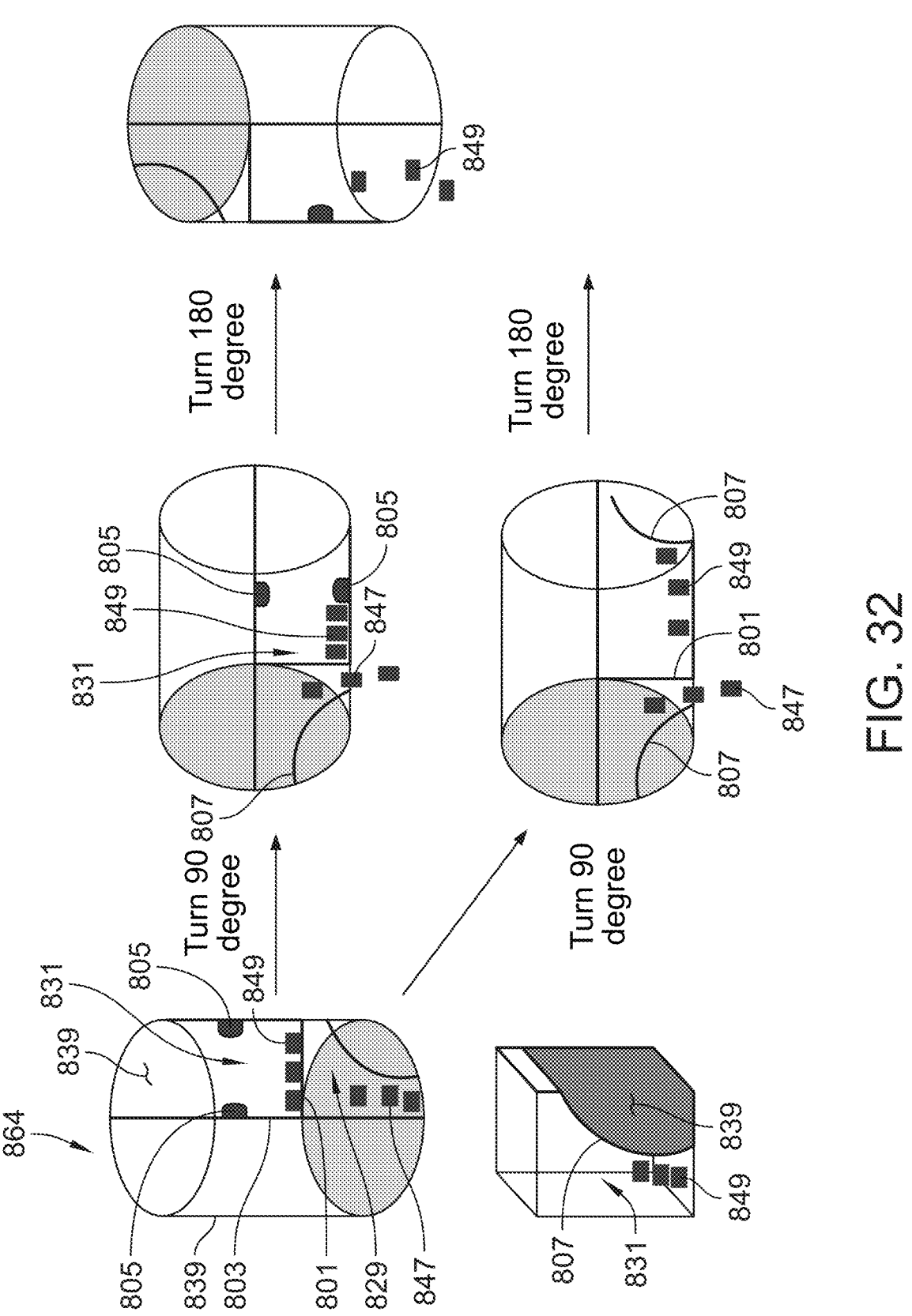
FIG. 32 is a perspective view of two embodiments of a dopant feeder having a dopant cup separated into dopant receptacles by partitions.

Another embodiment of the dopant feeder 864 is shown in FIG. 32. The components shown in FIG. 32 that are analogous to those of FIGS. 3-6 are designated by the corresponding reference number of FIGS. 3-6 plus "700" (e.g., part 123 becomes 823). The dopant cup 837 includes one or more partitions 801, 803 that divide the cup 837 into a plurality of cup sections or "dopant receptacles" 829, 831. The dopant cup 637 may include projections 805 (upper row embodiment) and/or ridges 807 (one in the upper row embodiment and two in the bottom row embodiment) that limit release of the dopant batches.

To dope the silicon melt by use of one of the dopant feeders described herein, the rotation mechanism is actuated to rotate the first dopant receptacle to release the first batch of dopant from the first dopant receptacle to cause the first batch of dopant to enter the silicon melt while pulling the single crystal silicon ingot from the silicon melt. After the first batch of dopant is released from the first dopant receptacle, the rotation mechanism is operated to rotate the second dopant receptacle to release the second batch of dopant from the second dopant receptacle and cause the second batch of dopant to enter the silicon melt while pulling the single crystal silicon ingot from the silicon melt. Depending on the number of batches loaded in the dopant feeder and its configuration (e.g., number of dopant receptacles), the rotation mechanism may be rotated further to add additional batches to the melt during ingot growth. In this respect, the rotation mechanism may include one or more stops 181 (FIG. 33) which limit rotation to ensure only a single batch is added during operation of the rotation mechanism. The stops may be pushed away to allow the next batch of dopant to be added. In some embodiments, the rotation mechanism may be arranged to prevent reverse rotation.

In some embodiments, the silicon melt is initially doped with a dopant of a first type (e.g., P-type or N-type). This initial dopant may be added by use of the dopant feeder of the present disclosure or by other methods. The batches of dopant added from the dopant receptacles of the dopant feeder during ingot growth may be of a second type that is opposite the first type to counter-dope the melt (i.e., when the initial dopant is P-type, the batches of dopant in the dopant receptacles of the dopant feeder are N-type and when the initial dopant is N-type, the batches of dopant in the dopant receptacles of the dopant feeder are P-type).

EXAMPLES

The processes of the present disclosure are further illustrated by the following Examples. These Examples should not be viewed in a limiting sense.

Example 1: Use of Dopant Cup Having First and Second Dopant Receptacles

Figure 34:
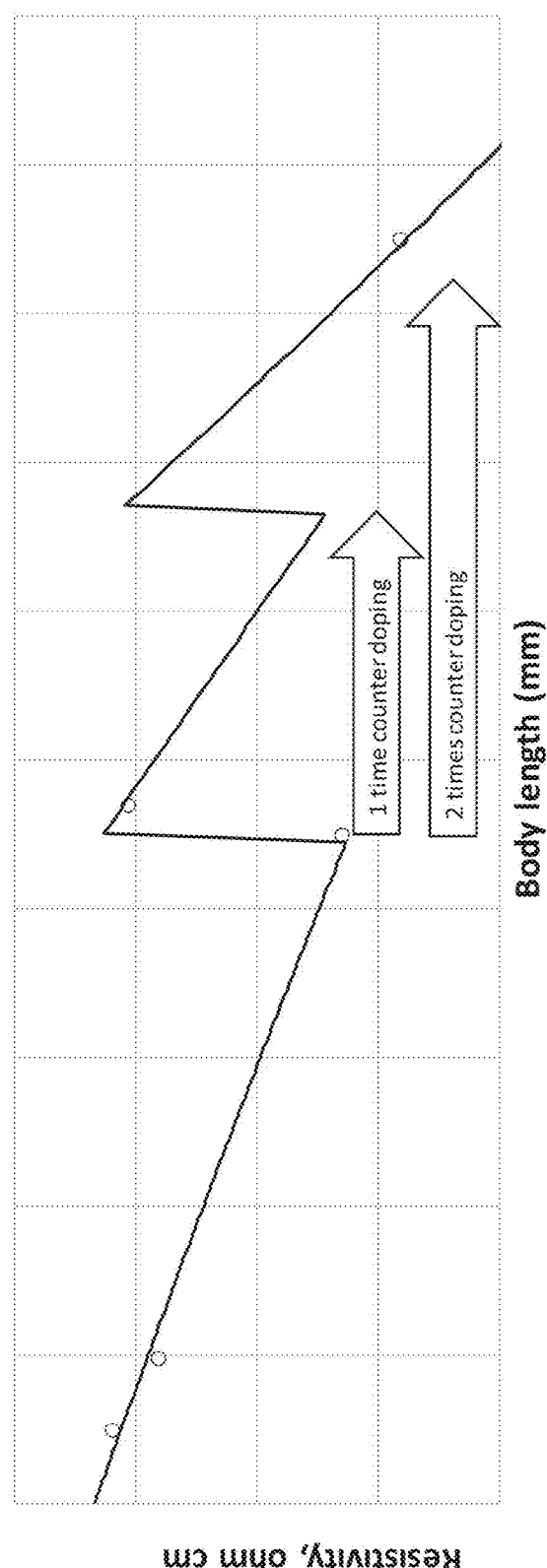
FIG. 34 is a graph of ingot resistivity over body length with addition of counter-dopant by the dopant feeder shown in FIGS. 3-6.

A dopant cup having first and second dopant receptacles as shown in FIGS. 3-6 was used to counter-dope with boron during ingot growth. The two-time counter-doping process is shown in FIG. 34. Resistivity (open circle slug data) matched the theoretical prediction (solid line). Counter-doping resulted in a 25% increase in prime length, prime yield, and prime throughput (i.e., the amount of the ingot within the resistivity specification) relative to the process of record (POR) as shown in Table 1 below.

TABLE 1

| | Increase in Prime Yield by Two-Step Boron Counter-Doping | | | |
|---|---|---|---|---|
| Condition | # of counter doping events | Prime crystal Length gain | Prime Throughput gain | Prime Yield gain |
| Process of Record | 1 | 1 | 1 | 1 |
| New | 2 | 1.25 | 1.25 | 1.251 |

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a," "an," "the," and "said" are intended to mean that there are one or more of the elements. The terms "comprising," "including," "containing," and "having" are intended to be inclusive and mean that there may be additional elements other than the listed elements. The use of terms indicating a particular orientation (e.g., "top," "bottom," "side," etc.) is for convenience of description and does not require any particular orientation of the item described.

As various changes could be made in the above constructions and methods without departing from the scope of the disclosure, it is intended that all matter contained in the above description and shown in the accompanying drawing [s] shall be interpreted as illustrative and not in a limiting sense.

What is claimed is:

1. A method for producing a single crystal silicon ingot from a silicon melt held within a crucible, the method comprising:

adding solid-state silicon to the crucible, the crucible being disposed within an ingot puller inner chamber;

heating the solid-state silicon to cause the silicon melt to form in the crucible;

pulling the single crystal silicon ingot from the silicon melt;

rotating a dopant cup, a first dopant receptacle and a second dopant receptacle being disposed within the dopant cup, the dopant cup comprising:

a sidewall;

a first dopant cup opening formed in the sidewall; and a second dopant cup opening; and wherein rotating the dopant cup causes:

the first dopant receptacle to rotate to release a first batch of solid-phase dopant from the first dopant receptacle and through a first dopant receptacle outlet to cause the first batch of solid-phase dopant to enter the silicon melt while pulling the single crystal silicon ingot from the silicon melt, the first dopant cup opening being aligned with the first dopant receptacle outlet; and the second dopant receptacle to rotate to release a second batch of solid-phase dopant from the second dopant receptacle and through a second dopant receptacle outlet to cause the second batch of solid-phase dopant to enter the silicon melt while pulling the single crystal silicon ingot from the silicon melt and after the first batch of solid-phase dopant is released from the first dopant receptacle, the second dopant cup opening being aligned with the second dopant receptacle outlet, the first dopant receptacle and the second dopant receptacle being disposed within a dopant feeder housing, the dopant feeder housing being external to an ingot puller outer housing.

2. The method as set forth in claim 1 further comprising adding a dopant of a first type to the crucible before pulling the single crystal silicon ingot from the silicon melt, the first type being p-type or n-type, wherein the first batch of solid-phase dopant released from the first dopant receptacle and the second batch of solid-phase dopant released from the second dopant receptacle are each a second type that is opposite that of the first type.

3. The method as set forth in claim 1 wherein the first dopant receptacle and the second dopant receptacle are part of a dopant feeder for adding dopant to the crucible.

4. The method as set forth in claim 3 wherein the first dopant receptacle is a tube and the second dopant receptacle is a tube.

5. The method as set forth in claim 1 wherein the dopant feeder comprises a third dopant receptacle disposed in the dopant cup for holding a third batch of solid-phase dopant, wherein rotating the dopant cup causes the third dopant receptacle to rotate to release the third batch of solid-phase dopant from the third dopant receptacle and cause the third batch of solid-phase dopant to enter the silicon melt while pulling the single crystal silicon ingot from the silicon melt and after the second batch of solid-phase dopant is released from the second dopant receptacle.

6. The method as set forth in claim 5 wherein the dopant feeder comprises a fourth dopant receptacle disposed in the dopant cup for holding a fourth batch of solid-phase dopant, wherein rotating the dopant cup causes the fourth dopant receptacle to release the fourth batch of solid-phase dopant from the third dopant receptacle and cause the fourth batch of solid-phase dopant to enter the silicon melt while pulling the single crystal silicon ingot from the silicon melt and after the third batch of solid-phase dopant is released from the third dopant receptacle.

7. The method as set forth in claim 1 comprising operating a handle to rotate the first and second dopant receptacles.

8. The method as set forth in claim 7 wherein the handle is connected to a shaft, the shaft extending through one or more bearings that enable the shaft to rotate.

9. The method as set forth in claim 1 wherein the dopant feeder comprises a funnel that is disposed below the first and second dopant receptacles, the funnel being connected to a dopant tube, wherein the first batch of solid-phase dopant falls through the funnel upon being released from the first dopant receptacle and the second batch of solid-phase dopant falls through the funnel upon being released from the second dopant receptacle.

10. A method for producing a single crystal silicon ingot from a silicon melt held within a crucible, the method comprising:

adding solid-state silicon to the crucible, the crucible being disposed within an ingot puller inner chamber;

heating the solid-state silicon to cause the silicon melt to form in the crucible;

pulling the single crystal silicon ingot from the silicon melt;

rotating a first dopant receptacle to release a first batch of dopant from the first dopant receptacle and cause the first batch of dopant to enter the silicon melt while pulling the single crystal silicon ingot from the silicon melt, the first dopant receptacle being disposed within a dopant cup, the dopant cup comprising a sidewall, a first dopant cup opening formed in the sidewall, and a second dopant cup opening, the dopant cup being rotated to cause the first batch of dopant to fall through a first dopant receptacle outlet and from the first dopant receptacle, the first dopant cup opening being aligned with the first dopant receptacle outlet; and rotating a second dopant receptacle to release a second batch of dopant from the second dopant receptacle and cause the second batch of dopant to enter the silicon melt while pulling the single crystal silicon ingot from the silicon melt and after the first batch of dopant is released from the first dopant receptacle, the second dopant receptacle being disposed within the dopant cup, the dopant cup being rotated to cause the second batch of dopant to fall through a second dopant receptacle outlet and from the second dopant receptacle, the second dopant cup opening being aligned with the second dopant receptacle outlet.

11. The method as set forth in claim 10 comprising:

rotating a third dopant receptacle to release a third batch of dopant from the third dopant receptacle and cause the third batch of dopant to enter the silicon melt while pulling the single crystal silicon ingot from the silicon melt and after the second batch of dopant is released from the second dopant receptacle, the third dopant receptacle being disposed within the dopant cup, the dopant cup being rotated to cause the third batch of dopant to fall from the third dopant receptacle; and rotating a fourth dopant receptacle to release a fourth batch of dopant from the fourth dopant receptacle and cause the fourth batch of dopant to enter the silicon melt while pulling the single crystal silicon ingot from the silicon melt and after the third batch of dopant is released from the third dopant receptacle, the fourth dopant receptacle being disposed within the dopant cup, the dopant cup being rotated to cause the fourth batch of dopant to fall from the fourth dopant receptacle.

12. The method as set forth in claim 10 wherein the first batch of dopant is a first batch of solid-phase dopant and the second batch of dopant is a second batch of solid-phase dopant.

13. A method for producing a single crystal silicon ingot from a silicon melt held within a crucible, the method comprising:

adding solid-state silicon to the crucible, the crucible being disposed within an ingot puller inner chamber;

heating the solid-state silicon to cause the silicon melt to form in the crucible;

pulling the single crystal silicon ingot from the silicon melt;

rotating a dopant cup, a first dopant receptacle and a second dopant receptacle being disposed within the dopant cup, the dopant cup comprising:

a sidewall;

a first dopant cup opening formed in the sidewall; and a second dopant cup opening; and wherein rotating the dopant cup causes:

the first dopant receptacle and the second dopant receptacle to rotate simultaneously in a first step to release a first batch of solid-phase dopant from the first dopant receptacle and through a first dopant receptacle outlet to cause the first batch of solid-phase dopant to enter the silicon melt while pulling the single crystal silicon ingot from the silicon melt, the first batch of solid-phase dopant being released only from the first dopant receptacle, the first dopant cup opening being aligned with the first dopant receptacle outlet; and the first dopant receptacle and the second dopant receptacle to rotate simultaneously in a second step to release a second batch of solid-phase dopant from the second dopant receptacle and through a second dopant receptacle outlet to cause the second batch of solid-phase dopant to enter the silicon melt while pulling the single crystal silicon ingot from the silicon melt, the second batch of solid-phase dopant only being released from the second dopant receptacle, the second dopant cup opening being aligned with the second dopant receptacle outlet.

14. The method as set forth in claim 13 wherein a third dopant receptacle and a fourth dopant receptacle are disposed in the dopant cup, wherein rotating the dopant cup causes:

the third dopant receptacle to rotate simultaneously with the first dopant receptacle and the second dopant receptacle in a third step to release a third batch of solid-phase dopant from the third dopant receptacle and cause the third batch of solid-phase dopant to enter the silicon melt while pulling the single crystal silicon ingot from the silicon melt and after the second batch of solid-phase dopant is released from the second dopant receptacle, the third batch of solid-phase dopant only being released from the third dopant receptacle; and the fourth dopant receptacle to rotate simultaneously with the first dopant receptacle, the second dopant receptacle, and the third dopant receptacle in a fourth step to release a fourth batch of solid-phase dopant from the fourth dopant receptacle and cause the fourth batch of solid-phase dopant to enter the silicon melt while pulling the single crystal silicon ingot from the silicon melt and after the third batch of solid-phase dopant is released from the third dopant receptacle, the fourth batch of solid-phase dopant only being released from the fourth dopant receptacle.

15. The method as set forth in claim 13 comprising operating a handle to rotate the first and second dopant receptacles.

* * * * *